United States Patent
Lee et al.

(10) Patent No.: US 12,088,291 B2
(45) Date of Patent: *Sep. 10, 2024

(54) APPARATUS FOR TRANSMITTING AND RECEIVING A SIGNAL, A METHOD OF OPERATING THE SAME, A MEMORY DEVICE, AND A METHOD OF OPERATING THE MEMORY DEVICE

(71) Applicant: SAMSUNG ELECTRONICS CO., LTD., Suwon-si (KR)

(72) Inventors: Changkyo Lee, Suwon-si (KR); Dongkeon Lee, Suwon-si (KR); Jinhoon Jang, Suwon-si (KR); Kyungsoo Ha, Suwon-si (KR); Kiseok Oh, Suwon-si (KR); Kyungryun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/372,726

(22) Filed: Sep. 26, 2023

(65) Prior Publication Data

US 2024/0014817 A1    Jan. 11, 2024

Related U.S. Application Data

(63) Continuation of application No. 17/987,032, filed on Nov. 15, 2022, now Pat. No. 11,799,479, which is a
(Continued)

(30) Foreign Application Priority Data

Dec. 21, 2018 (KR) .................. 10-2018-0167576
Apr. 29, 2019 (KR) .................. 10-2019-0049826

(51) Int. Cl.
*H03K 19/00* (2006.01)
*G06F 3/06* (2006.01)
(Continued)

(52) U.S. Cl.
CPC ....... *H03K 19/0005* (2013.01); *G06F 3/0604* (2013.01); *G06F 3/061* (2013.01);
(Continued)

(58) Field of Classification Search
CPC ....... H03K 19/0005; H03K 19/017545; H03K 19/01825; G06F 3/0604; G06F 3/061;
(Continued)

(56) References Cited

U.S. PATENT DOCUMENTS 9,721,630 B2    8/2017  Stott et al.
9,780,782 B2 *  10/2017 Bains ................ H03K 19/0008
(Continued)

FOREIGN PATENT DOCUMENTS

CN   108877853    11/2018
CN   108932960    12/2018
(Continued)

OTHER PUBLICATIONS

Notice of Allowance issued in corresponding U.S. Appl. No. 17/577,141 on Jan. 20, 2023.
(Continued)

*Primary Examiner* — Seokjin Kim
(74) *Attorney, Agent, or Firm* — F. CHAU & ASSOCIATES, LLC

(57) ABSTRACT

A signal transmitting and receiving apparatus including: a first on-die termination circuit connected to a first pin through which a first signal is transmitted or received and, when enabled, the first on-die termination circuit is configured to provide a first termination resistance to a signal line connected to the first pin; a second on-die termination circuit
(Continued)

connected to a second pin through which a second signal is transmitted or received and, when enabled, the second on-die termination circuit is configured to provide a second termination resistance to a signal line connected to the second pin; and an on-die termination control circuit configured to independently control an enable time and a disable time of each of the first on-die termination circuit and the second on-die termination circuit.

20 Claims, 13 Drawing Sheets

Related U.S. Application Data continuation of application No. 17/974,873, filed on Oct. 27, 2022, now Pat. No. 11,799,478, which is a continuation of application No. 17/577,141, filed on Jan. 17, 2022, now Pat. No. 11,664,803, which is a continuation of application No. 17/024,229, filed on Sep. 17, 2020, now Pat. No. 11,245,397, which is a continuation of application No. 16/552,147, filed on Aug. 27, 2019, now Pat. No. 10,797,700.

(51) Int. Cl.
  *G11C 7/10* (2006.01)
  *H03K 19/0175* (2006.01)
  *H03K 19/018* (2006.01)

(52) U.S. Cl.
  CPC .......... *G11C 7/1051* (2013.01); *G11C 7/1084* (2013.01); *H03K 19/017545* (2013.01); *H03K 19/01825* (2013.01)

(58) Field of Classification Search
  CPC ............. G06F 13/4086; G06F 13/4072; G11C 7/1051; G11C 7/1084; G11C 7/1057; G11C 11/4093
  See application file for complete search history.

(56) References Cited

U.S. PATENT DOCUMENTS

| | | | |
|---|---|---|---|
| 10,089,040 B2 * | 10/2018 | Oh | .......................... G11C 5/066 |
| 10,141,935 B2 * | 11/2018 | Bains | ............. H03K 19/017545 |
| 10,153,014 B1 | 12/2018 | Mazumder | |
| 10,318,464 B1 | 6/2019 | Jiang et al. | |
| 10,340,022 B2 | 7/2019 | Kim et al. | |
| 10,566,038 B2 | 2/2020 | Son et al. | |
| 10,797,700 B2 | 10/2020 | Lee et al. | |
| 11,245,397 B2 | 2/2022 | Lee et al. | |
| 11,664,803 B2 | 8/2023 | Lee et al. | |
| 2005/0268059 A1 | 12/2005 | Laberge | |
| 2007/0040574 A1 | 2/2007 | Janzen et al. | |
| 2010/0109704 A1 | 5/2010 | Carr et al. | |
| 2013/0002291 A1 | 1/2013 | Park | |
| 2014/0140152 A1 | 5/2014 | Takeyama et al. | |
| 2017/0093400 A1 | 3/2017 | Bains et al. | |
| 2017/0194962 A1 | 7/2017 | Bains et al. | |
| 2017/0255412 A1 | 9/2017 | Cox et al. | |
| 2017/0288634 A1 | 10/2017 | Kang et al. | |
| 2017/0372760 A1 * | 12/2017 | Kim | ........................ G11C 7/222 |
| 2018/0005686 A1 | 1/2018 | Oh et al. | |
| 2018/0026634 A1 | 1/2018 | Park et al. | |
| 2018/0039588 A1 | 2/2018 | Yun et al. | |
| 2018/0276158 A1 | 9/2018 | Jung | |
| 2018/0342274 A1 * | 11/2018 | Son | .......................... H03H 7/38 |
| 2019/0096468 A1 | 3/2019 | Mccall et al. | |
| 2019/0121577 A1 | 4/2019 | Mazumder et al. | |
| 2019/0155544 A1 | 5/2019 | Stave et al. | |
| 2019/0287581 A1 * | 9/2019 | Mazumder | ........... H03K 19/003 |
| 2019/0392886 A1 | 12/2019 | Cox et al. | |
| 2020/0004436 A1 | 1/2020 | Jiang et al. | |
| 2020/0204179 A1 * | 6/2020 | Lee | ................ H03K 19/017545 |
| 2021/0006247 A1 | 1/2021 | Lee et al. | |
| 2022/0140829 A1 | 5/2022 | Lee et al. | |
| 2023/0048973 A1 | 2/2023 | Lee et al. | |
| 2023/0075459 A1 | 3/2023 | Lee et al. | |

FOREIGN PATENT DOCUMENTS

| | | |
|---|---|---|
| TW | 1435334 | 4/2014 |
| TW | 201709065 | 3/2017 |

OTHER PUBLICATIONS

Office Action issued in corresponding IN Patent Application No. 201924052973 on Dec. 15, 2022.
Office Action issued in corresponding U.S. Appl. No. 17/974,873 on Feb. 8, 2023.
Office Action issued in corresponding TW Patent Application No. 108144444 on Mar. 29, 2023.
Office Action issued in corresponding KR Patent Application No. 10-2019-0049826 on Apr. 26, 2024.
First Office Action issued on Jun. 26, 2024 in corresponding CN Patent Application No. 201911130434.2.

* cited by examiner

APPARATUS FOR TRANSMITTING AND RECEIVING A SIGNAL, A METHOD OF OPERATING THE SAME, A MEMORY DEVICE, AND A METHOD OF OPERATING THE MEMORY DEVICE

CROSS-REFERENCE TO RELATED APPLICATIONS

This application is a continuation of U.S. patent application Ser. No. 17/987,032 filed on Nov. 15, 2022, which is a continuation of U.S. patent application Ser. No. 17/974,873 filed on Oct. 27, 2022, which is a continuation of U.S. patent application Ser. No. 17/577,141 filed on Jan. 17, 2022, now U.S. Pat. No. 11,664,803 issued on May 30, 2023, which is a continuation of U.S. patent application Ser. No. 17/024,229 filed on Sep. 17, 2020, now U.S. Pat. No. 11,245,397 issued on Feb. 8, 2022, which is a continuation of U.S. patent application Ser. No. 16/552,147 filed on Aug. 27, 2019, now U.S. Pat. No. 10,797,700 issued on Oct. 6, 2020, which claims priority under 35 U.S.C. § 119 to Korean Patent Application No. 10-2018-0167576, filed on Dec. 21, 2018, and Korean Patent Application No. 10-2019-0049826, filed on Apr. 29, 2019, in the Korean Intellectual Property Office, the disclosures of which are incorporated by reference herein in their entireties.

TECHNICAL FIELD

The inventive concept relates to a signal transmitting and receiving apparatus and a memory device, each including an on-die termination circuit, and a method of operating each of the signal transmitting and receiving apparatus and the memory device.

DISCUSSION OF RELATED ART

Mobile-oriented memory devices including low-power double data rate (LPDDR) synchronous dynamic random access memory (SDRAM) are used in mobile electronic devices such as smart phones, tablet personal computers (PCs), and ultra books. This is so, because LPDDR SDRAM consumes low amounts of power. As the size of an operating system (OS) increases to support multi-tasking in mobile electronic devices, the mobile electronic devices may have enhanced low-power consumption characteristics and high-speed operating performance.

On-die termination is technology for increasing signal integrity by suppressing signal reflection in an interface between a transmitting device and a receiving device. For example, on-die termination technology includes a termination resistor for impedance matching in transmission lines inside a semiconductor chip instead of a printed circuit board.

SUMMARY

According to an exemplary embodiment of the inventive concept, there is provided a signal transmitting and receiving apparatus including: a first on-die termination circuit connected to a first pin through which a first signal is transmitted or received and, when enabled, the first on-die termination circuit is configured to provide a first termination resistance to a signal line connected to the first pin; a second on-die termination circuit connected to a second pin through which a second signal is transmitted or received and, when enabled, the second on-die termination circuit is configured to provide a second termination resistance to a signal line connected to the second pin; and an on-die termination control circuit configured to independently control an enable time and a disable time of each of the first on-die termination circuit and the second on-die termination circuit.

According to another exemplary embodiment of the inventive concept, there is provided a method of operating an apparatus that transmits or receives a signal through a first pin and a second pin, the method including: disabling a first on-die termination circuit and a second on-die termination circuit, the first on-die termination circuit being connected to the first pin and, when enabled, the first on-die termination circuit provides a first termination resistance to a signal line connected to the first pin, and the second on-die termination circuit being connected to the second pin and, when enabled, the second on-die termination circuit provides a second termination resistance to a signal line connected to the second pin; enabling the first on-die termination circuit; and enabling the second on-die termination circuit a period of time after the first on-die termination circuit is enabled.

According to another exemplary embodiment of the inventive concept, there is provided a memory device including: a first on-die termination circuit connected to a data pin for transmitting or receiving a data signal and, when enabled, the first on-die termination circuit is configured to provide a first termination resistance to a signal line connected to the data pin; a second on-die termination circuit connected to a read data strobe pin for transmitting or receiving a read data strobe signal and, when enabled, the second on-die termination circuit is configured to provide a second termination resistance to a signal line connected to the read data strobe pin; and an on-die termination control circuit configured to independently control an enable timing or a disable timing of the first on-die termination circuit and an enable timing or a disable timing of the second on-die termination circuit.

According to another exemplary embodiment of the inventive concept, there is provided a method of operating a memory device, which transmits or receives a data signal through a data pin and transmits a read data strobe signal through a read data strobe pin, the method including: receiving a data read command from outside the memory device; disabling a first on-die termination circuit and a second on-die termination circuit, the first on-die termination circuit being connected to the data pin and, when enabled, the first on-die termination circuit provides a first termination resistance to a signal line connected to the data pin, and the second on-die termination circuit being connected to the read data strobe pin and, when enabled, the second on-die termination circuit provides a second termination resistance to a signal line connected to the read data strobe pin; enabling the first on-die termination circuit; and enabling the second on-die termination circuit a period of time after the first on-die termination circuit is enabled.

According to another exemplary embodiment of the inventive concept, there is provided a sub-memory system comprising a plurality of memory ranks, wherein at least one of the plurality of memory ranks includes a first on-die termination circuit connected to a data pin for transmitting or receiving a data signal; and a second on-die termination circuit connected to a read data strobe pin for transmitting a read data strobe signal, wherein the first on-die termination circuit and the second on-die termination circuit of a non-target memory rank among the plurality of memory ranks are enabled, the first on-die termination circuit and the second on-die termination circuit of a target memory rank among the plurality of memory ranks are disabled during a read operation of the target memory rank; and a time period, during which the first on-die termination circuit of the target memory rank is disabled, is included in a time period, during which the second on-die termination circuit of the target memory rank is disabled, in the read operation of the target memory rank.

According to an exemplary embodiment of the inventive concept, there is provided a method of operating a memory device, the method including: receiving a data read command; disabling a second on-die termination circuit after a first time period and disabling a first on-die termination circuit after a second time period, wherein the second time period is greater than the first time period, the first time period and the second time period starting when the data read command is received; enabling the first on-die termination circuit after a third time period and enabling the second on-die termination circuit after a fourth time period, wherein the fourth time period is greater than the third time period, the third time period and the fourth time period starting when the data read command is received; and receiving data through a data pin connected to the first on-die termination circuit when the first on-die termination circuit is enabled before the second on-die termination circuit is enabled.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
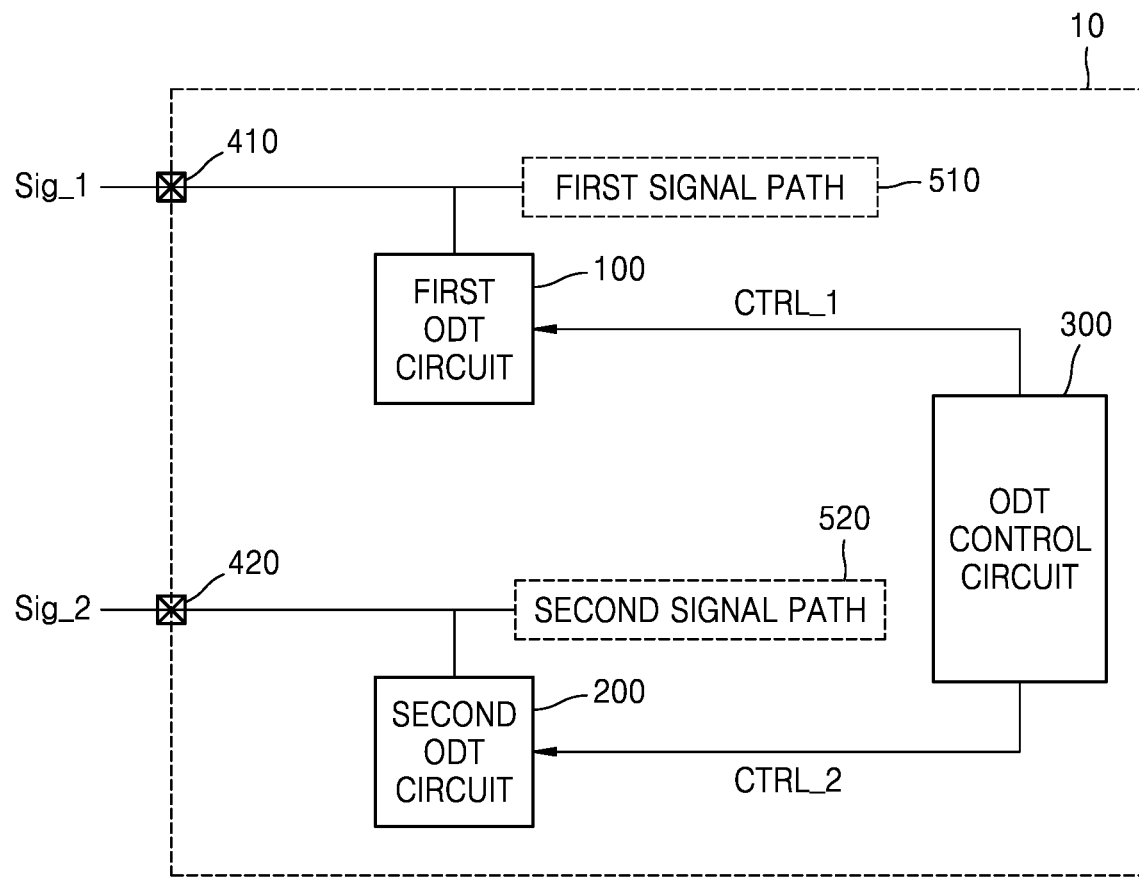
FIG. 1 illustrates a signal transmitting and receiving apparatus according to an exemplary embodiment of the inventive concept.

Hereinafter, exemplary embodiments of the inventive concept will be described in detail with reference to the accompanying drawings. Like reference numerals may refer to like elements in the drawings.

FIG. 1 illustrates a signal transmitting and receiving apparatus 10 according to an exemplary embodiment of the inventive concept. The signal transmitting and receiving apparatus 10 may include a first on-die termination circuit 100, a second on-die termination circuit 200, an on-die termination control circuit 300, a first pin 410, and a second pin 420. Hereinafter, for convenience of description, the first on-die termination circuit 100 may be referred to as a first ODT circuit 100, the second on-die termination circuit 200 may be referred to as a second ODT circuit 200, and the on-die termination control circuit 300 may be referred to as an ODT control circuit 300.

The signal transmitting and receiving apparatus 10 may transmit a first signal Sig_1 outside the signal transmitting and receiving apparatus 10 through the first pin 410 and receive the first signal Sig_1 from outside the signal transmitting and receiving apparatus 10 through the first pin 410. The first signal Sig_1 to be transmitted through the first pin 410 may be provided to the first pin 410 via a first signal path 510. The first signal Sig_1 received through the first pin 410 may transit inside the signal transmitting and receiving apparatus 10 via the first signal path 510. The first signal path 510 may include various circuit elements that process the first signal Sig_1.

The signal transmitting and receiving apparatus 10 may transmit a second signal Sig_2 outside the signal transmitting and receiving apparatus 10 through the second pin 420 and receive the second signal Sig_2 from outside the signal transmitting and receiving apparatus 10 through the second pin 420. The second signal Sig 2 to be transmitted through the second pin 420 may be provided to the second pin 420 via a second signal path 520. The second signal Sig_2 received through the second pin 420 may transit inside the signal transmitting and receiving apparatus 10 via the second signal path 520. The second signal path 520 may include various circuit elements that process the second signal Sig_2.

As for the first pin 410 and the second pin 420, the term "pin" may refer to an electrical connection to an integrated circuit and may include, for example, another electrical contact point on a pad or an integrated circuit.

The first ODT circuit 100 may be electrically connected to the first pin 410 and provide a termination resistance to a signal line connected to the first pin 410 when the first ODT circuit 100 is enabled. The first ODT circuit 100 may be controlled by the ODT control circuit 300. For example, the first ODT circuit 100 may be controlled based on a first control signal CTRL_1 provided by the ODT control circuit 300. In an exemplary embodiment of the inventive concept, the first ODT circuit 100 may be enabled or disabled based on the first control signal CTRL_1, and accordingly, the termination resistance of the first ODT circuit 100 may be changed.

The second ODT circuit 200 may be electrically connected to the second pin 420 and provide a termination resistance to a signal line connected to the second pin 420 when the second ODT circuit 200 is enabled. The second ODT circuit 200 may be controlled by the ODT control circuit 300. For example, the second ODT circuit 200 may be controlled based on a second control signal CTRL_2 provided by the ODT control circuit 300. In an exemplary embodiment of the inventive concept, the second ODT circuit 200 may be enabled or disabled based on the second control signal CTRL_2, and accordingly, the termination resistance of the second ODT circuit 200 may be changed.

The ODT control circuit 300 may control the first ODT circuit 100 and the second ODT circuit 200. For example, the ODT control circuit 300 may control the first ODT circuit 100 by providing the first control signal CTRL_1 to the first ODT circuit 100 and control the second ODT circuit 200 by providing the second control signal CTRL_2 to the second ODT circuit 200.

The ODT control circuit 300 may be implemented in various forms in the signal transmitting and receiving apparatus 10. According to exemplary embodiments of the inventive concept, the ODT control circuit 300 may be implemented by hardware or software. When the ODT control circuit 300 is implemented by hardware, the ODT control circuit 300 may include circuits that control the first ODT circuit 100 and the second ODT circuit 200. When the ODT control circuit 300 is implemented by software, the first ODT circuit 100 and the second ODT circuit 200 may be controlled by executing a program (or instructions) using an internal control logic or at least one internal processor. The program or the instructions may be stored in a memory of the signal transmitting and receiving apparatus 10. However, the ODT control circuit 300 is not limited to these embodiments and may be implemented by a combination of software and hardware, e.g., firmware.

According to an exemplary embodiment of the inventive concept, the ODT control circuit 300 may separately or independently control the first ODT circuit 100 and the second ODT circuit 200. In an exemplary embodiment of the inventive concept, the ODT control circuit 300 may independently control enable and/or disable timing of the first ODT circuit 100 and the second ODT circuit 200.

For example, when each of the first pin 410 and the second pin 420 is in a first mode not requiring termination resistance, the ODT control circuit 300 may control the first ODT circuit 100 and the second ODT circuit 200 to be disabled at different time points. In an exemplary embodiment of the inventive concept, the first mode may refer to a mode in which a signal is transmitted outside the signal transmitting and receiving apparatus 10, but is not limited thereto.

In an exemplary embodiment of the inventive concept, when each of the first pin 410 and the second pin 420 changes from the first mode not requiring termination resistance to a second mode requiring termination resistance, the ODT control circuit 300 may control the first ODT circuit 100 and the second ODT circuit 200 such that the enable timing of the first ODT circuit 100 is different from that of the second ODT circuit 200. In an exemplary embodiment of the inventive concept, the second mode may refer to a mode in which a signal is received from outside the signal transmitting and receiving apparatus 10, but is not limited thereto.

In an exemplary embodiment of the inventive concept, when each of the first pin 410 and the second pin 420 changes from the first mode to the second mode, the ODT control circuit 300 may control the first ODT circuit 100 and the second ODT circuit 200 such that the second ODT circuit 200 is enabled a predetermined time after the first ODT circuit 100 is enabled. The signal transmitting and receiving apparatus 10 may transmit or receive the first signal Sig_1 through the first pin 410 before the second ODT circuit 200 is enabled after the first ODT circuit 100 is enabled. In the case that the first ODT circuit 100 is enabled after the second ODT circuit 200 is enabled, the signal transmitting and receiving apparatus 10 may transmit or receive the second signal Sig_2 through the second pin 420 before the first ODT circuit 100 is enabled after the second ODT circuit 200 is enabled.

According to an exemplary embodiment of the inventive concept, since the signal transmitting and receiving apparatus 10 may independently control the enable and/or disable timing of the first ODT circuit 100 and the second ODT circuit 200, the first ODT circuit 100 may be enabled when the second ODT circuit 200 is disabled. Therefore, the signal transmitting and receiving apparatus 10 may transmit or receive the first signal Sig_1 through the first pin 410 in the second mode requiring termination resistance. Therefore, performance degradation caused by preamble and/or postamble time that may occur when there are ODT circuits in a signal transmitting and receiving apparatus may be prevented.

Figure 2:
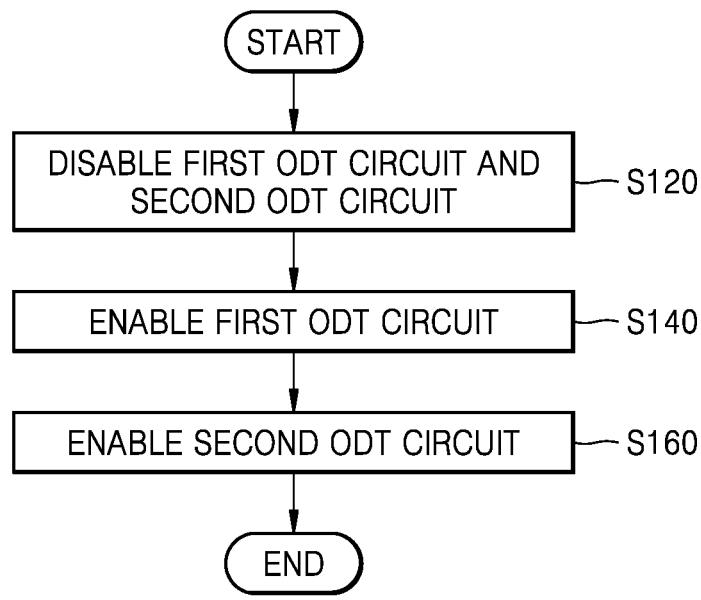
FIG. 2 illustrates a method of operating a signal transmitting and receiving apparatus, according to an exemplary embodiment of the inventive concept.

FIG. 2 illustrates a method of operating a signal transmitting and receiving apparatus, according to an exemplary embodiment of the inventive concept. Descriptions will be made with reference to FIGS. 1 and 2.

The signal transmitting and receiving apparatus 10 may disable the first ODT circuit 100 and the second ODT circuit 200 in operation S120. For example, when the first pin 410 and the second pin 420 are in the first mode not requiring termination resistance, the ODT control circuit 300 may control the first ODT circuit 100 and the second ODT circuit 200 to be disabled.

The signal transmitting and receiving apparatus 10 may enable the first ODT circuit 100 in operation S140. For example, when the first pin 410 changes from the first mode not requiring termination resistance to the second mode requiring termination resistance, the ODT control circuit 300 may control the first ODT circuit 100 to be enabled.

The signal transmitting and receiving apparatus 10 may enable the second ODT circuit 200 in operation S160. For example, when the second pin 420 changes from the first mode not requiring termination resistance to the second mode requiring termination resistance, the ODT control circuit 300 may control the second ODT circuit 200 to be enabled. In an exemplary embodiment of the inventive concept, the ODT control circuit 300 may control the first ODT circuit 100 and the second ODT circuit 200 such that an enable time point of the second ODT circuit 200 is different from that of the first ODT circuit 100. For example, the ODT control circuit 300 may control the first ODT circuit 100 and the second ODT circuit 200 such that the second ODT circuit 200 is enabled a predetermined time after the first ODT circuit 100 is enabled.

In an exemplary embodiment of the inventive concept, the signal transmitting and receiving apparatus 10 may receive the first signal Sig_1 through the first pin 410 before the second ODT circuit 200 is enabled after the first ODT circuit 100 is enabled.

According to an exemplary embodiment of the inventive concept, since the signal transmitting and receiving apparatus 10 may independently control the enable and/or disable timing of the first ODT circuit 100 and the second ODT circuit 200, the first ODT circuit 100 may be enabled when the second ODT circuit 200 is disabled. Therefore, the signal transmitting and receiving apparatus 10 may receive the first signal Sig_1 through the first pin 410 in the second mode requiring termination resistance. Therefore, performance degradation caused by preamble and/or postamble time that may occur when there are ODT circuits in the signal transmitting and receiving apparatus 10 may be prevented.

Figure 3:
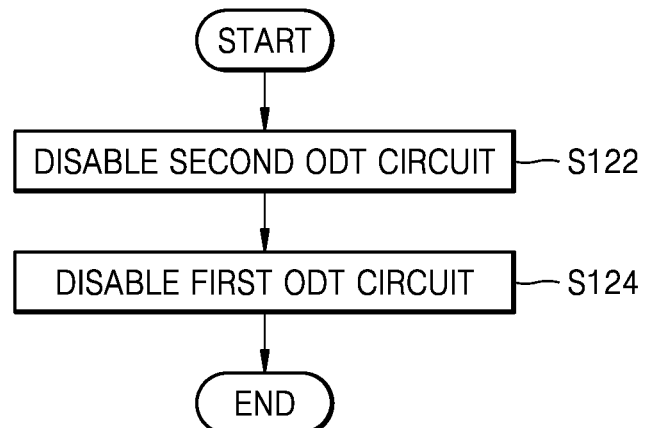
FIG. 3 illustrates a method of operating a signal transmitting and receiving apparatus, according to an exemplary embodiment of the inventive concept.

FIG. 3 illustrates a method of operating a signal transmitting and receiving apparatus, according to an exemplary embodiment of the inventive concept. In particular, FIG. 3 may illustrate sub-operations of operation S120 in FIG. 2. Descriptions will be made with reference to FIGS. 1 and 3.

The signal transmitting and receiving apparatus 10 may disable the second ODT circuit 200 in operation S122. For example, when the second pin 420 is in the first mode not requiring termination resistance, the ODT control circuit 300 may control the second ODT circuit 200 to be disabled. For example, the second control signal CTRL_2 may disable the second ODT circuit 200.

The signal transmitting and receiving apparatus 10 may disable the first ODT circuit 100 in operation S124. For example, when the first pin 410 is in the first mode not requiring termination resistance, the ODT control circuit 300 may control the first ODT circuit 100 to be disabled. For example, the first control signal CTRL_1 may disable the first ODT circuit 100. In an exemplary embodiment of the inventive concept, the ODT control circuit 300 may control the first ODT circuit 100 and the second ODT circuit 200 such that a disable time point of the first ODT circuit 100 is different from that of the second ODT circuit 200. For example, the ODT control circuit 300 may control the first ODT circuit 100 and the second ODT circuit 200 such that the first ODT circuit 100 is disabled a predetermined time after the second ODT circuit 200 is disabled.

A method of controlling the first ODT circuit 100 and the second ODT circuit 200 will be described below in detail with reference to the drawings.

Figure 4:
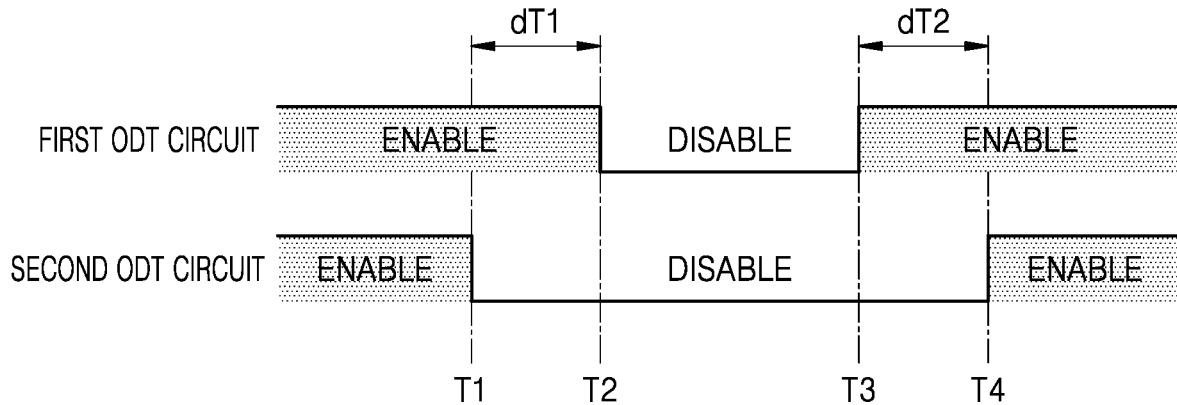
FIG. 4 is a timing chart showing the states of a first on-die termination circuit and a second on-die termination circuit over time, according to an exemplary embodiment of the inventive concept.

FIG. 4 is a timing chart showing the states of a first on-die termination circuit and a second on-die termination circuit over time, according to an exemplary embodiment of the inventive concept. Descriptions will be made with reference to FIGS. 1 and 4.

In an exemplary embodiment of the inventive concept, the first ODT circuit 100 and the second ODT circuit 200 may be maintained in an enabled state by default.

At a time point T1, the second ODT circuit 200 may be disabled. For example, the ODT control circuit 300 may control the second ODT circuit 200 to be disabled at the first time point T1. For example, the second control signal CTRL_2 may disable the second ODT circuit 200.

At a second time point T2, e.g., after a first time period dT1' elapses from the first time point T1, the first ODT circuit 100 may be disabled. For example, the first control signal CTRL_1 may disable the first ODT circuit 100. The first time period dT1 may be a predetermined time and may be a value stored in the ODT control circuit 300 of the signal transmitting and receiving apparatus 10. In other words, the ODT control circuit 300 may disable the first ODT circuit 100 after the first time period dT1 elapses, while the second ODT circuit 200 is disabled.

At a third time point T3, the first ODT circuit 100 may be enabled. For example, when the first pin 410 changes from the first mode not requiring termination resistance to the second mode requiring termination resistance, the ODT control circuit 300 may control the first ODT circuit 100 to be enabled. For example, the first control signal CTRL_1 may enable the first ODT circuit 100.

At a fourth time point T4, e.g., after a second time period dT2 elapses from the third time point T3, the second ODT circuit 200 may be enabled. For example, the second control signal CTRL_2 may enable the second ODT circuit 200. The second time period dT2 may be a predetermined time and may be a value stored in the ODT control circuit 300 of the signal transmitting and receiving apparatus 10. According to an exemplary embodiment of the inventive concept, the second time period dT2 may be the same as or different from the first time period dT1. In other words, the ODT control circuit 300 may enable the second ODT circuit 200 after the second time period dT2 elapses, while the first ODT circuit 100 is enabled.

According to an exemplary embodiment of the inventive concept, the signal transmitting and receiving apparatus 10 may receive the first signal Sig_1 through the first pin 410 in the second mode requiring termination resistance in a time period between the third time point T3 and the fourth time point T4. In other words, the signal transmitting and receiving apparatus 10 receives a signal through the first pin 410 in the second mode in a time period during which the second ODT circuit 200 is disabled, thereby enhancing performance of the signal transmitting and receiving apparatus 10.

Figure 5A:
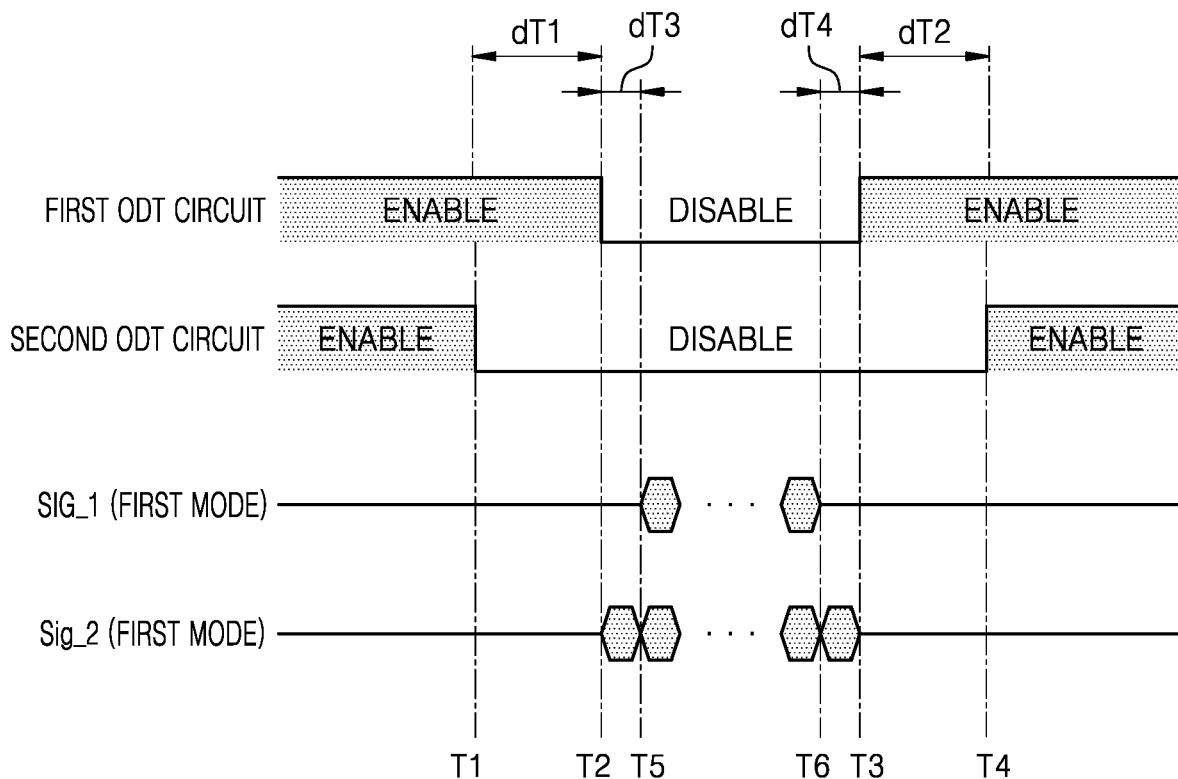
FIGS. 5A and 5B are timing charts showing the states of a first on-die termination circuit and a second on-die termination circuit, a first signal, and a second signal over time, according to exemplary embodiments of the inventive concept.
Figure 5B:
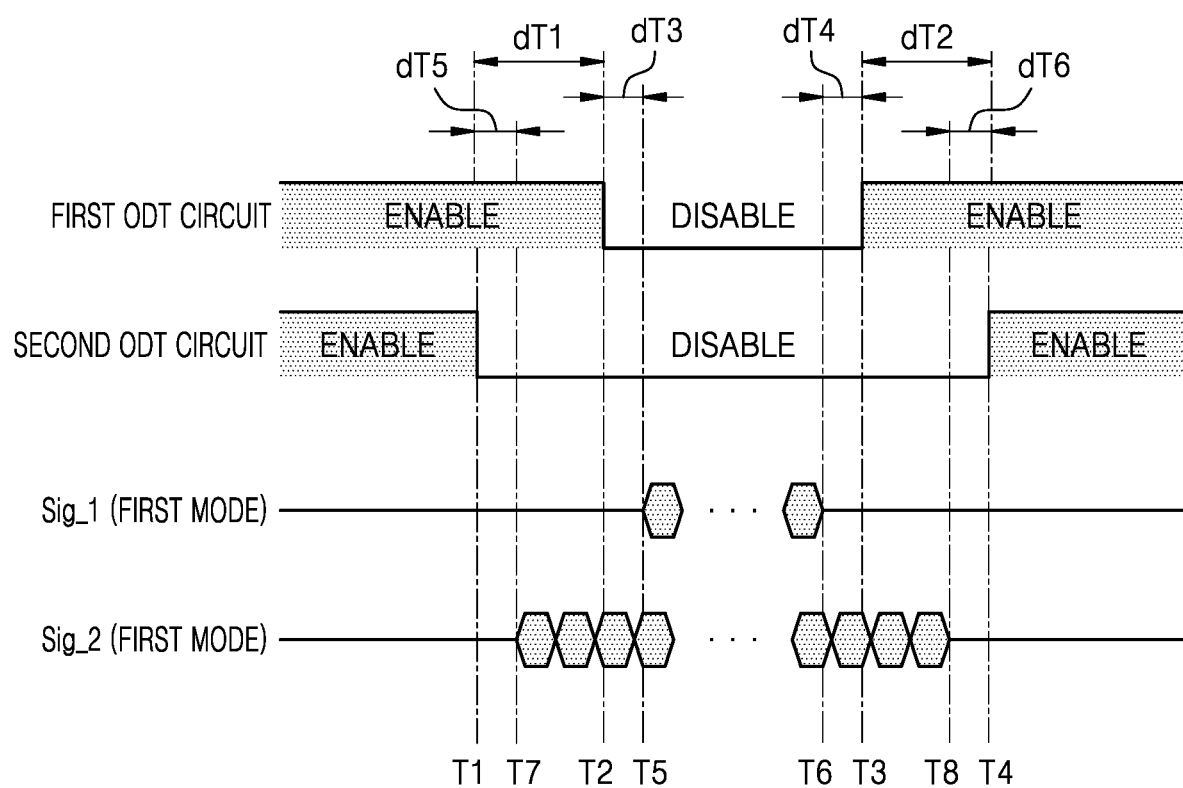

FIGS. 5A and 5B are timing charts showing the states of a first on-die termination circuit and a second on-die termination circuit, the first signal Sig_1, and the second signal Sig_2 over time, according to exemplary embodiments of the inventive concept. In particular, FIGS. 5A and 5B further show the timing of the first signal Sig_1 and the second signal Sig_2 in addition to the timing chart of FIG. 4. Descriptions will be made with reference to FIGS. 1, 5A, and 5B, and redundant descriptions made with reference to FIG. 4 will be omitted.

Referring to FIG. 5A, in a time period between the second time point T2 and the third time point T3, the signal transmitting and receiving apparatus 10 may transmit the second signal Sig_2 through the second pin 420 in the first mode not requiring termination resistance. In an exemplary embodiment of the inventive concept, the first mode may refer to a mode in which a signal is transmitted outside the signal transmitting and receiving apparatus 10 (but is not limited thereto). The signal transmitting and receiving apparatus 10 may transmit the second signal Sig_2 outside the signal transmitting and receiving apparatus 10 through the second pin 420 in the time period between the second time point T2 and the third time point T3.

In a time period between a fifth time point T5 and a sixth time point T6, the signal transmitting and receiving apparatus 10 may transmit the first signal Sig_1 through the first pin 410 in the first mode not requiring termination resistance. The signal transmitting and receiving apparatus 10 may transmit the first signal Sig_1 outside the signal transmitting and receiving apparatus 10 through the first pin 410 in the time period between the fifth time point T5 and the sixth time point T6.

The fifth time point T5 may come after a third time period dT3 elapses from the second time point T2. The sixth time point T6 may come earlier than the third time point T3 by a fourth time period dT4. According to an exemplary embodiment of the inventive concept, the third time period dT3 may be the same as or different from the fourth time period dT4.

When the first signal Sig_1 and the second signal Sig_2 are transmitted, the second ODT circuit 200 is to be disabled with a time margin before and after a time period, during which each of the first signal Sig_1 and the second signal Sig_2 is transmitted, according to specifications of the signal transmitting and receiving apparatus 10. According to the related art, the first ODT circuit 100 and the second ODT circuit 200 are controlled to be enabled and/or disabled at the same time. In this case, the first ODT circuit 100 is maintained in a disabled state during a time period corresponding to the time margin.

Contrarily, according to an exemplary embodiment of the inventive concept, the signal transmitting and receiving apparatus 10 independently controls the first ODT circuit 100 and the second ODT circuit 200. In this case, the first ODT circuit 100 may be controlled to be in the enabled state in the time period between the third time point T3 and the fourth time point T4, during which the second ODT circuit 200 is in the disabled state. Accordingly, the signal transmitting and receiving apparatus 10 may receive the first signal Sig_1 through the first pin 410 in the time period between the third time point T3 and the fourth time point T4 in the second mode requiring termination resistance. In other words, the signal transmitting and receiving apparatus 10 may have enhanced performance by receiving a signal through the first pin 410 in the second mode even in a time period during which the second ODT circuit 200 is disabled.

Referring to FIG. 5B, in a time period between a seventh time point T7 and an eighth time point T8, the signal transmitting and receiving apparatus 10 may transmit the second signal Sig_2 through the second pin 420 in the first mode not requiring termination resistance. The signal transmitting and receiving apparatus 10 may transmit the second signal Sig_2 outside the signal transmitting and receiving apparatus 10 through the second pin 420 in the time period between the seventh time point T7 and the eighth time point T8.

The seventh time point T7 may come after a fifth time period dT5 elapses from the first time point TI. The eighth time point T8 may come earlier than the fourth time point T4 by a sixth time period dT6. According to an exemplary embodiment of the inventive concept, the fifth time period dT5 may be the same as or different from the sixth time period dT6.

Figure 6A:
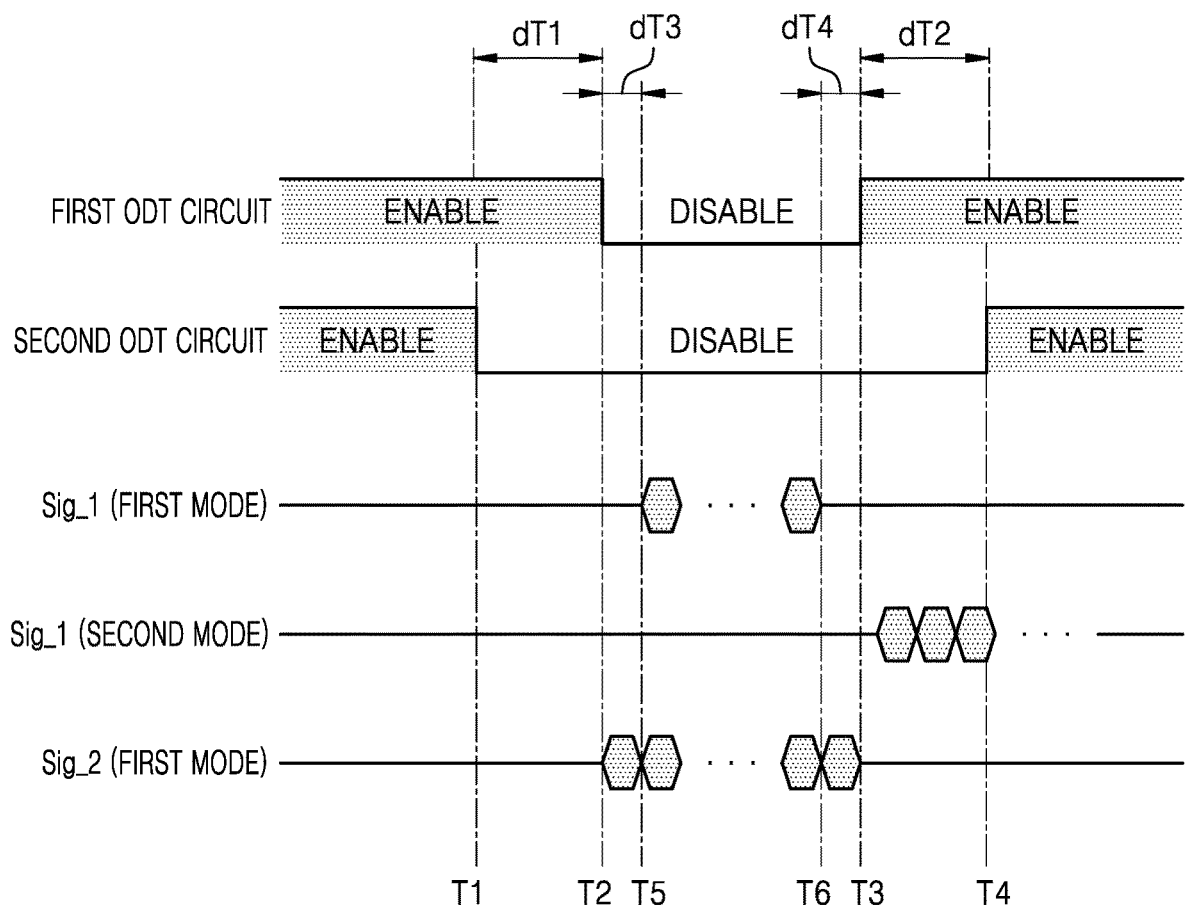
FIGS. 6A and 6B are timing charts showing the states of a first on-die termination circuit and a second on-die termination circuit, a first signal, and a second signal over time, according to exemplary embodiments of the inventive concept.
Figure 6B:
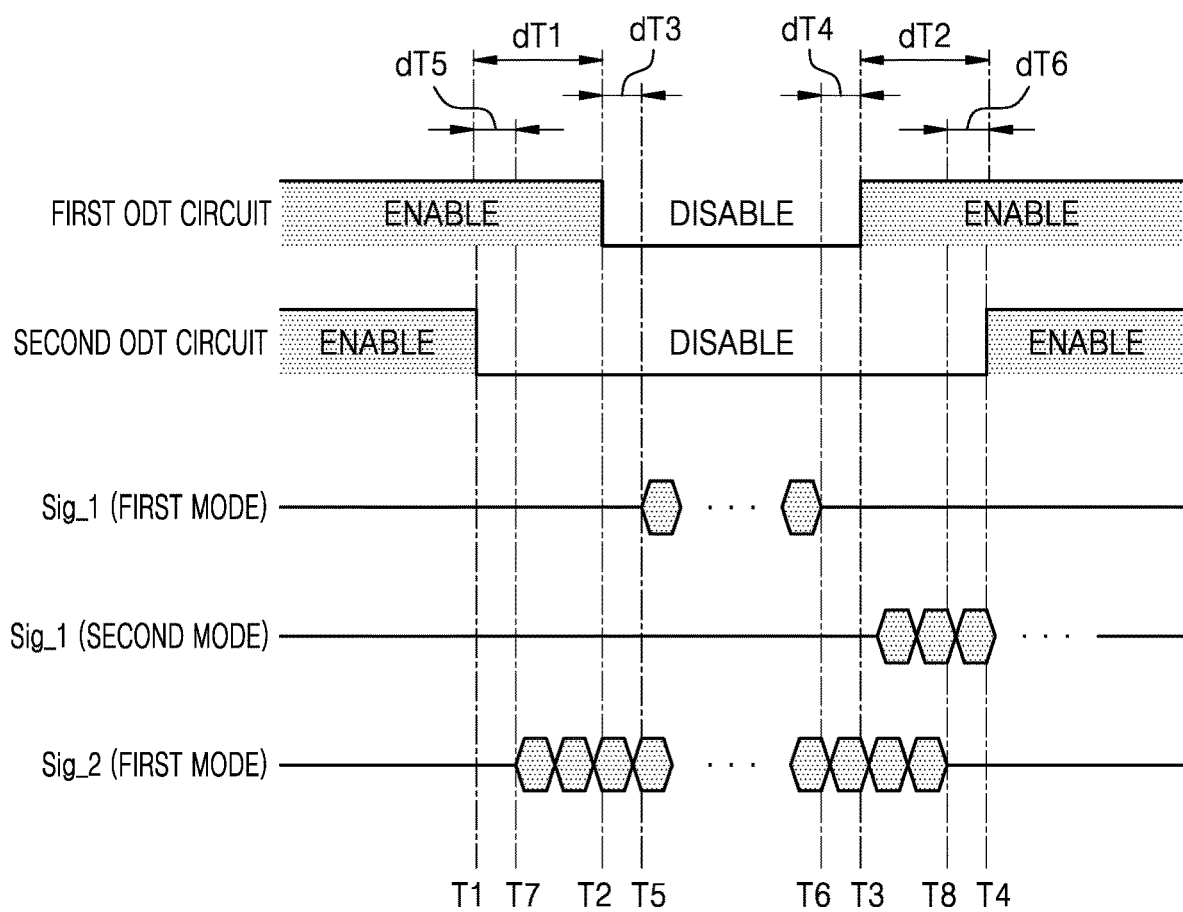

FIGS. 6A and 6B are timing charts showing the states of a first on-die termination circuit and a second on-die termination circuit, the first signal Sig_1, and the second signal Sig_2 over time, according to exemplary embodiments of the inventive concept. In particular, FIGS. 6A and 6B further show the timing of the first signal Sig_1, which is received in the second mode, in addition to the timing charts of FIGS. 5A and 5B, respectively. Descriptions will be made with reference to FIGS. 1, 6A, and 6B, and redundant descriptions made with reference to FIGS. 4, 5A, and 5B will be omitted.

Referring to FIG. 6A, in the time period between the third time point T3 and the fourth time point T4, the signal transmitting and receiving apparatus 10 may receive the first signal Sig_1 through the first pin 410 in the second mode requiring termination resistance. In other words, before the second ODT circuit 200 is enabled after the first ODT circuit 100 is enabled, the signal transmitting and receiving apparatus 10 may receive the first signal Sig_1 through the first pin 410 in the second mode.

Referring to FIG. 6B, in the time period between the third time point T3 and the fourth time point T4, the signal transmitting and receiving apparatus 10 may receive the first signal Sig_1 through the first pin 410 in the second mode requiring termination resistance. In other words, before the second ODT circuit 200 is enabled after the first ODT circuit 100 is enabled, the signal transmitting and receiving apparatus 10 may receive the first signal Sig_1 through the first pin 410 in the second mode.

According to an exemplary embodiment of the inventive concept, the signal transmitting and receiving apparatus 10 may receive the first signal Sig_1 through the first pin 410 in the second mode, which requires termination resistance, in the time period between the third time point T3 and the fourth time point T4. In other words, the signal transmitting and receiving apparatus 10 may have enhanced performance by receiving a signal through the first pin 410 in the second mode without waiting for the second ODT circuit 200 to be enabled at the fourth time point T4.

Figure 7:
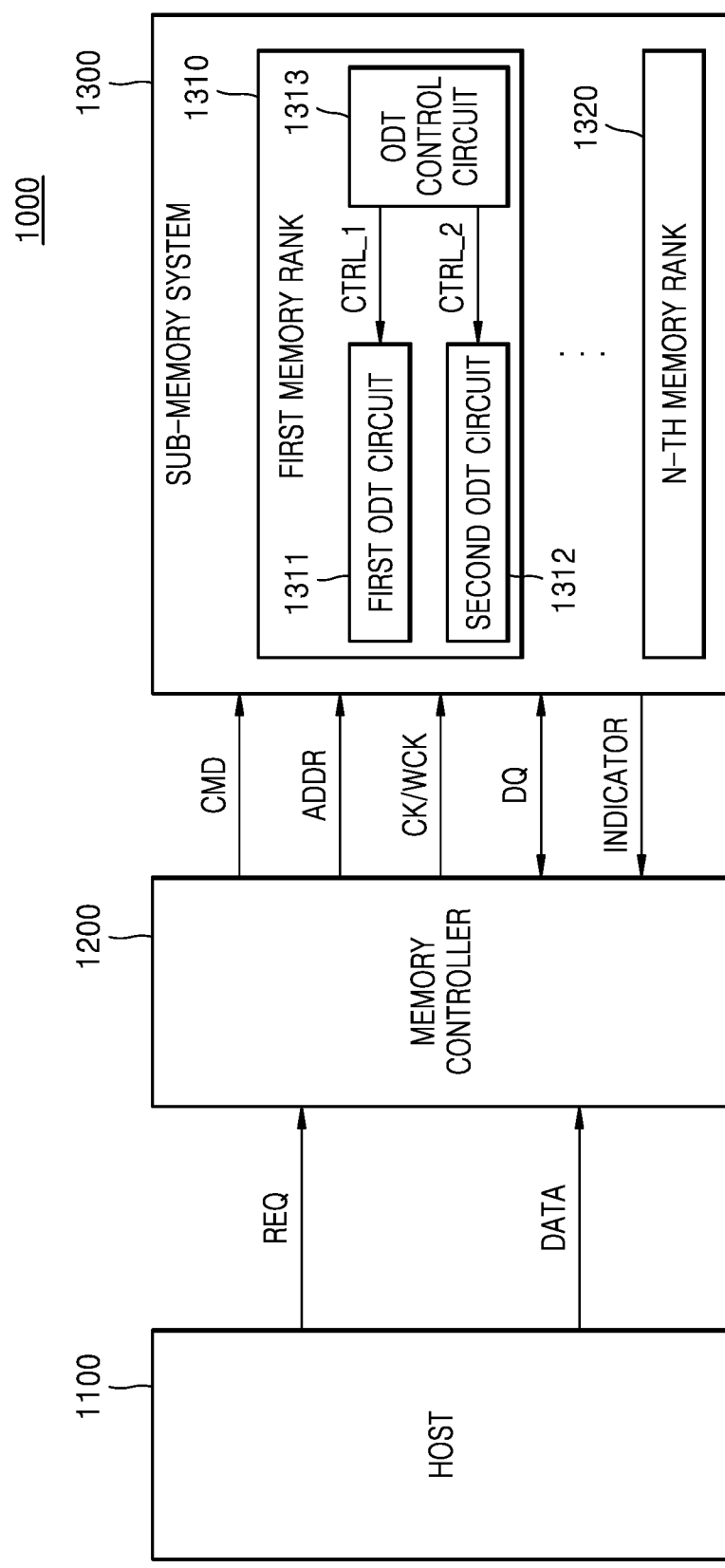
FIG. 7 illustrates a data processing system according to an exemplary embodiment of the inventive concept.

FIG. 7 illustrates a data processing system 1000 according to an exemplary embodiment of the inventive concept. The data processing system 1000 may include a host 1100, a memory controller 1200, and a sub-memory system 1300. The data processing system 1000 may be applied to various kinds of electronic devices using memory, such as various kinds of servers, desktop computers, notebook computers, smart phones, tablet personal computers (PCs), printers, scanners, monitors, digital cameras, digital music players, digital media recorders, and portable game consoles, but is not limited thereto. Each of a first memory rank 1310 through an N-th memory rank 1320, which are included in the sub-memory system 1300 in FIG. 7, may include the signal transmitting and receiving apparatus 10 described above with reference to FIGS. 1 through 6B, wherein N is a natural number.

The host 1100 may provide data DATA and a request signal REQ to the memory controller 1200. For example, the host 1100 may provide the memory controller 1200 with the request signal REQ such as a read request or a write request for the data DATA. In addition, the host 1100 may provide the memory controller 1200 with a command, an address, priority information, etc., and is not limited thereto. The host 1100 may exchange data and signals with the memory controller 1200 based on various interface protocols such as a universal serial bus (USB) protocol, a multimedia card (MC) protocol, a serial advanced technology attachment (ATA) protocol, a parallel ATA protocol, a small computer small interface (SCSI) protocol, an enhanced small disk interface (ESDI) protocol, or an integrated drive electronics (IDE) protocol. The host 1100 and the memory controller 1200 may be implemented together as a system-on-chip (SoC) or an application processor, each including a central processing unit (CPU) and/or a graphics processing unit (GPU).

The memory controller 1200 may control the sub-memory system 1300 in response to the request signal REQ of the host 1100. For example, the memory controller 1200 may control the sub-memory system 1300 to read data DQ in response to a read request received from the host 1100. The memory controller 1200 may control the sub-memory system 1300 to write the data DQ in response to a write request received from the host 1100. For those operations, the memory controller 1200 may provide a command CMD and an address ADDR to the sub-memory system 1300, and the data DQ to be written or the data DQ that has been read may be transmitted and received between the memory controller 1200 and the sub-memory system 1300. The memory controller 1200 may provide a main clock signal CK and a data clock signal WCK to the sub-memory system 1300. The main clock signal CK and the data clock signal WCK may be used in the memory controller 1200 and the sub-memory system 1300 for data communication. As a non-limiting example, a frequency of the data clock signal WCK may be two or four times a frequency of the main clock signal CK.

The sub-memory system 1300 may include a plurality of memory ranks. For example, the sub-memory system 1300 may include the first memory rank 1310 through the N-th memory rank 1320. Each of the memory ranks may include a plurality of on-die termination circuits and an on-die termination control circuit. For example, the first memory rank 1310 may include a first on-die termination circuit 1311, a second on-die termination circuit 1312, and an on-die termination control circuit 1313. For convenience of description, "on-die termination" is abbreviated as "ODT" hereinbelow. For example, the first on-die termination circuit 1311 may be referred to as a first ODT circuit 1311, the second on-die termination circuit 1312 may be referred to as a second ODT circuit 1312, and the on-die termination control circuit 1313 may be referred to as an ODT control circuit 1313.

As a representative of the memory ranks, the first memory rank 1310 is described.

Each of the first ODT circuit 1311 and the second ODT circuit 1312 may suppress signal reflection by providing a termination resistance that matches the impedance of a transmission line.

In an exemplary embodiment of the inventive concept, the first ODT circuit 1311 may be electrically connected to a data pin, through which the data DQ is transmitted or received. The first ODT circuit 1311 may be enabled or disabled based on the first control signal CTRL_1 from the ODT control circuit 1313. In addition, the size of the termination resistance of the first ODT circuit 1311 may be changed based on the first control signal CTRL_1.

In an exemplary embodiment of the inventive concept, the second ODT circuit 1312 may be electrically connected to a data strobe pin, through which a data strobe signal is transmitted. The second ODT circuit 1312 may be enabled or disabled based on the second control signal CTRL_2 from the ODT control circuit 1313. In addition, the size of the termination resistance of the second ODT circuit 1312 may be changed based on the second control signal CTRL_2. In an exemplary embodiment of the inventive concept, the data strobe signal may correspond to a read data strobe signal RDQS, and the data strobe pin may correspond to a read data strobe pin.

In other words, the enable and disabling timing of the first ODT circuit 1311 and the second ODT circuit 1312 may be controlled. In particular, according to an exemplary embodiment of the inventive concept, the first memory rank 1310 may separately or independently control the first ODT circuit 1311 and the second ODT circuit 1312 using the first control signal CTRL_1 and the second control signal CTRL_2. In other words, the enable and disable timing of the first ODT circuit 1311 may be different from that of the second ODT circuit 1312. The timing of the first ODT circuit 1311 and the second ODT circuit 1312 will be described below in detail with reference to the drawings.

The ODT control circuit 1313 may control the first ODT circuit 1311 and the second ODT circuit 1312. For example, the ODT control circuit 1313 may control the first ODT circuit 1311 using the first control signal CTRL_1 and control the second ODT circuit 1312 using the second control signal CTRL_2.

The ODT control circuit 1313 may be implemented in various forms in the first memory rank 1310. According to an exemplary embodiment of the inventive concept, the ODT control circuit 1313 may be implemented by hardware or software. For example, when the ODT control circuit 1313 is implemented by hardware, the ODT control circuit 1313 may include circuits that control ODT circuits, e.g., the first and second ODT circuits 1311 and 1312. When the ODT control circuit 1313 is implemented by software, ODT circuits, e.g., the first and second ODT circuits 1311 and 1312, may be controlled by executing a program (or instructions) and/or random input/output code, each stored in the first memory rank 1310, using an internal control logic or at least one internal processor. However, the ODT control circuit 1313 is not limited to these embodiments and may be implemented by a combination of software and hardware, e.g., firmware.

The first memory rank 1310 may include at least one memory device. Here, the memory device may be a volatile memory device. The volatile memory device may be a random access memory (RAM), dynamic RAM (DRAM), or static RAM (SRAM) but is not limited thereto. Examples of the memory device may include double data rate (DDR) synchronous DRAM (SDRAM), low power DDR (LPDDR) SDRAM, graphics DDR (GDDR) SDRAM, and Rambus DRAM (RDRAM). Alternatively, the memory device may be a high bandwidth memory (HBM). In an exemplary embodiment of the inventive concept, the memory device may be a non-volatile memory device. For example, the memory device may be a resistive-type memory such as phase-change RAM (PRAM), magnetic RAM (MRAM), or resistive RAM (RRAM). In some cases, each of a plurality of memory ranks may be referred to as a memory device.

Memory ranks using ODT technology may operate in a non-target ODT mode or a normal ODT mode. Here, the normal ODT mode may refer to a mode, in which an ODT circuit is enabled or disabled based on a command provided by a memory controller. The non-target ODT mode may refer to a mode, in which an ODT circuit is enabled by default and is disabled under the control of a memory controller only when a data read operation is performed on a corresponding memory rank. According to an exemplary embodiment of the inventive concept, the sub-memory system 1300 or a plurality of memory ranks may operate in the non-target ODT mode. The non-target ODT mode will be described in detail with reference to FIG. 8.

In an exemplary embodiment of the inventive concept, the sub-memory system 1300 may provide the read data strobe signal RDQS to the memory controller 1200 in a data read operation. In an exemplary embodiment of the inventive concept, the read data strobe signal RDQS may be synchronized with the data clock signal WCK. The memory controller 1200 may receive the read data DQ based on the read data strobe signal RDQS provided by the sub-memory system 1300.

In an exemplary embodiment of the inventive concept, the sub-memory system 1300 may provide an indicator signal INDICATOR to the memory controller 1200. The indicator signal INDICATOR may indicate that the sub-memory system 1300 supports the non-target ODT mode and/or that the first ODT circuit 1311 and the second ODT circuit 1312 may be separately controlled. In an exemplary embodiment of the inventive concept, the sub-memory system 1300 may provide the indicator signal INDICATOR to the memory controller 1200 through a mode register, and the memory controller 1200 may obtain the indicator signal INDICATOR by reading the mode register. Based on the indicator signal INDICATOR, the memory controller 1200 may recognize that the sub-memory system 1300 supports the non-target ODT mode and/or that the first ODT circuit 1311 and the second ODT circuit 1312 are separately controlled.

According to an exemplary embodiment of the inventive concept, since the first memory rank 1310 performs enable and/or disable timing control independently on the first ODT circuit 1311 and the second ODT circuit 1312 in the data processing system 1000, performance degradation caused by a read data strobe signal RDQS preamble and/or postamble may be reduced.

In addition, since the first memory rank 1310 provides the same timing control as that in the normal ODT mode even when the first memory rank 1310 operates in the non-target ODT mode, the control operations of the memory controller 1200 may be unified. Accordingly, the control operations of the memory controller 1200 may be facilitated.

Figure 8:
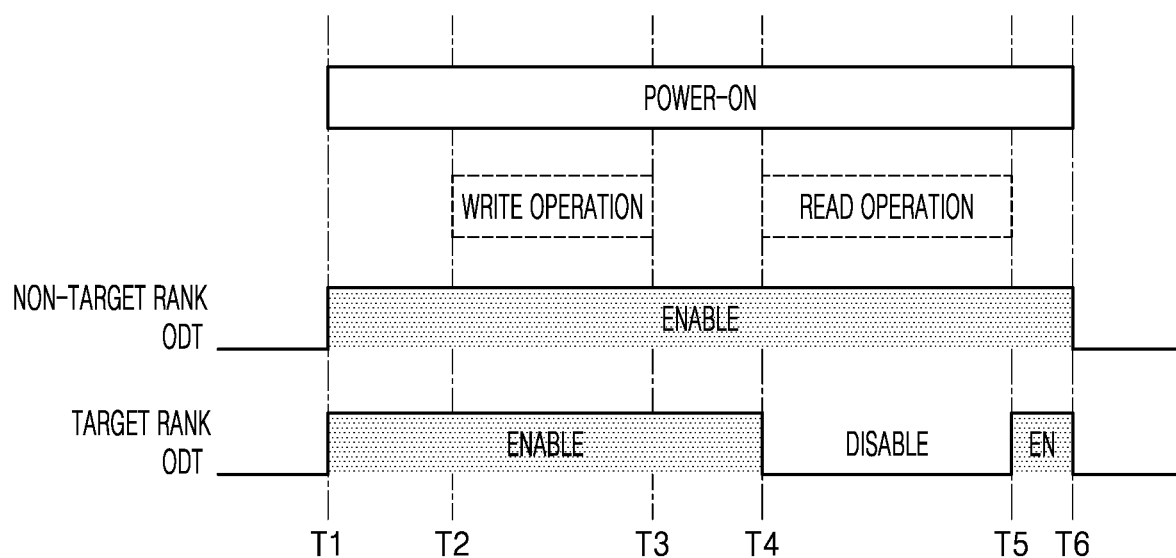
FIG. 8 illustrates a timing chart of signals to explain a non-target on-die termination mode, according to an exemplary embodiment of the inventive concept.

FIG. 8 illustrates a timing chart of signals to explain a non-target ODT mode, according to an exemplary embodiment of the inventive concept. Descriptions will be made with reference to FIGS. 7 and 8. The first through sixth time points T1 through T6 in FIG. 8 indicate different time points than those in FIGS. 4 through 6B.

The sub-memory system 1300 may include a plurality of memory ranks. The memory ranks may include a target memory rank, on which a current data operation (e.g., a write operation or a read operation) is performed, and non-target memory rank, on which the current data operation is not performed. FIG. 8 is a timing chart showing whether an ODT circuit included in the non-target memory rank and an ODT circuit included in the target memory rank are enabled.

The sub-memory system 1300 may be powered on in a time period between the first time point T1 and the sixth time point T6. At the first time point T1 when the sub-memory system 1300 starts to be powered on, the ODT circuit of the non-target memory rank and the ODT circuit of the target memory rank may be enabled.

Thereafter, the ODT circuit of the non-target memory rank may be maintained enabled. For example, the ODT circuit of the non-target memory rank may be enabled in the time period between the first time point T1 and the sixth time point T6. In an exemplary embodiment of the inventive concept, the ODT circuit of the non-target memory rank may be maintained enabled by default. In other words, the ODT circuit of the non-target memory rank may be maintained enabled, unless a memory controller disables the ODT circuit of the non-target memory rank.

The ODT circuit of the target memory rank may be maintained enabled during a write operation. For example, the ODT circuit of the target memory rank may be maintained enabled in a time period between the second time point T2 and the third time point T3 in which the write operation is performed.

When a read operation is performed, the ODT circuit of the target memory rank may be disabled. For example, the ODT circuit of the target memory rank may be disabled in a time period between the fourth time point T4 and the fifth time point T5 in which the read operation is performed.

In other words, the ODT circuit of the target memory rank may be disabled only when a read operation is performed.

Figure 9:
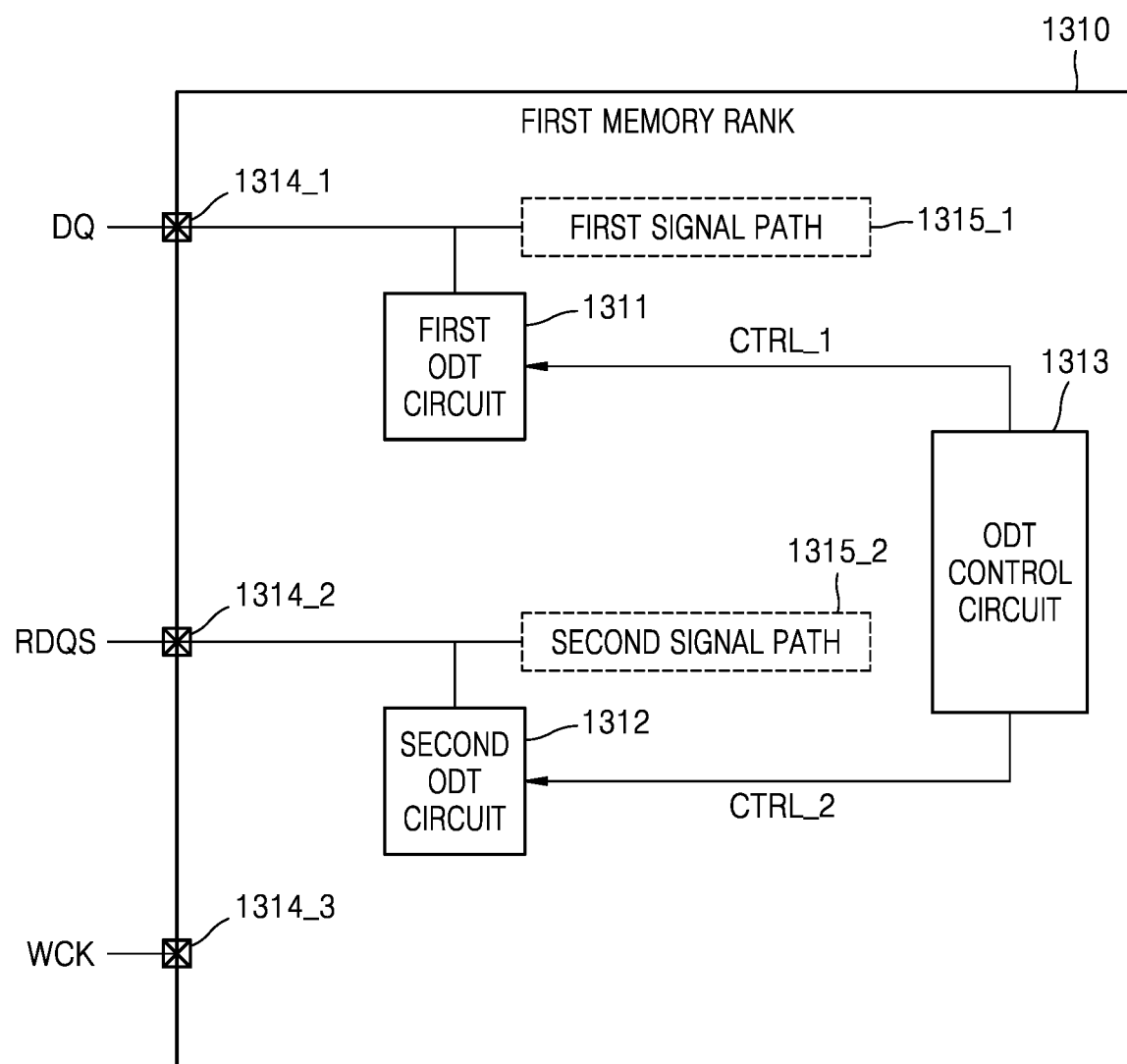
FIG. 9 illustrates a first memory rank according to an exemplary embodiment of the inventive concept.

FIG. 9 illustrates the first memory rank 1310 according to an exemplary embodiment of the inventive concept. The first memory rank 1310 of FIG. 9 may correspond to the signal transmitting and receiving apparatus 10 of FIG. 1. Redundant descriptions made about first memory rank 1310 with reference to FIG. 7 will be omitted. Descriptions will be made with reference to FIGS. 7 and 9.

The first memory rank 1310 may include the first ODT circuit 1311, the second ODT circuit 1312, the ODT control circuit 1313, a data pin 1314_1, a read data strobe pin 1314_2, and a data clock signal pin 1314_3.

The first memory rank 1310 may transmit the data DQ through the data pin 1314_1 to the memory controller 1200 outside the first memory rank 1310 and may receive the data DQ through the data pin 1314_1 from outside the first memory rank 1310. The data DQ to be transmitted through the data pin 1314_1 may be provided to the data pin 1314_1 via a first signal path 1315_1. The data DQ received through the data pin 1314_1 may transit inside the first memory rank 1310 via the first signal path 1315_1. The first signal path 1315_1 may include various circuit elements that process the data DQ. For example, the first signal path 1315_1 may include a data input/output buffer.

The first memory rank 1310 may transmit the read data strobe signal RDQS outside the first memory rank 1310 through the read data strobe pin 1314_2. The read data strobe signal RDQS to be transmitted through the read data strobe pin 1314_2 may be provided to the read data strobe pin 1314_2 via a second signal path 13152. The second signal path 1315_2 may include various circuit elements that process the read data strobe signal RDQS.

As for the data pin 1314_1 and the read data strobe pin 1314_2, the term "pin" may refer to electrical connection to an integrated circuit and may include, for example, another electrical contact point on a pad or an integrated circuit.

The first ODT circuit 1311 may be electrically connected to the data pin 1314_1 and provide a termination resistance to a signal line connected to the data pin 1314_1 when the first ODT circuit 1311 is enabled. The first ODT circuit 1311 may be controlled by the ODT control circuit 1313. For example, the first ODT circuit 1311 may be controlled based on the first control signal CTRL_1 provided by the ODT control circuit 1313. In an exemplary embodiment of the inventive concept, the first ODT circuit 1311 may be enabled or disabled based on the first control signal CTRL_1, and accordingly, the termination resistance of the first ODT circuit 1311 may be changed. Furthermore, a resistance amount of the first ODT circuit 1311 may be controlled by the ODT control circuit 1313.

The second ODT circuit 1312 may be electrically connected to the read data strobe pin 1314_2 and provide a termination resistance to a signal line connected to the read data strobe pin 1314_2 when the second ODT circuit 1312 is enabled. The second ODT circuit 1312 may be controlled by the ODT control circuit 1313. For example, the second ODT circuit 1312 may be controlled based on the second control signal CTRL_2 provided by the ODT control circuit 1313. In an exemplary embodiment of the inventive concept, the second ODT circuit 1312 may be enabled or disabled based on the second control signal CTRL_2, and accordingly, the termination resistance of the second ODT circuit 1312 may be changed. Furthermore, a resistance amount of the second ODT circuit 1312 may be controlled by the ODT control circuit 1313.

The ODT control circuit 1313 may control the first ODT circuit 1311 and the second ODT circuit 1312. For example, the ODT control circuit 1313 may control the first ODT circuit 1311 by providing the first control signal CTRL_1 to the first ODT circuit 1311 and control the second ODT circuit 1312 by providing the second control signal CTRL_2 to the second ODT circuit 1312.

According to an exemplary embodiment of the inventive concept, the ODT control circuit 1313 may separately or independently control the first ODT circuit 1311 and the second ODT circuit 1312. For example, the ODT control circuit 1313 may independently control the enable and/or disable timing of the first ODT circuit 1311 and the second ODT circuit 1312.

For example, the ODT control circuit 1313 may control the first ODT circuit 1311 and the second ODT circuit 1312 to be disabled in a data read operation. In this case, a disable time point of the first ODT circuit 1311 may be different from that of the second ODT circuit 1312.

In an exemplary embodiment of the inventive concept, before or after the data read operation is completed, the ODT control circuit 1313 may control the first ODT circuit 1311 and the second ODT circuit 1312 to be enabled such that the enable timing of the first ODT circuit 1311 may be different from that of the second ODT circuit 1312.

In an exemplary embodiment of the inventive concept, before or after the data read operation is completed, the ODT control circuit 1313 may control the first ODT circuit 1311 and the second ODT circuit 1312 such that the second ODT circuit 1312 is enabled a predetermined time after the first ODT circuit 1311 is enabled. The first memory rank 1310 may receive the data DQ through the data pin 1314_1 before the second ODT circuit 1312 is enabled after the first ODT circuit 1311 is enabled.

According to an exemplary embodiment of the inventive concept, the first memory rank 1310 may independently control the enable and/or disable timing of the first ODT circuit 1311 and the second ODT circuit 1312, thereby receiving the data DQ through the data pin 1314_1. Accordingly, performance degradation caused by preamble and/or postamble time that may occur when there are ODT circuits in a memory rank may be prevented.

Figure 10:
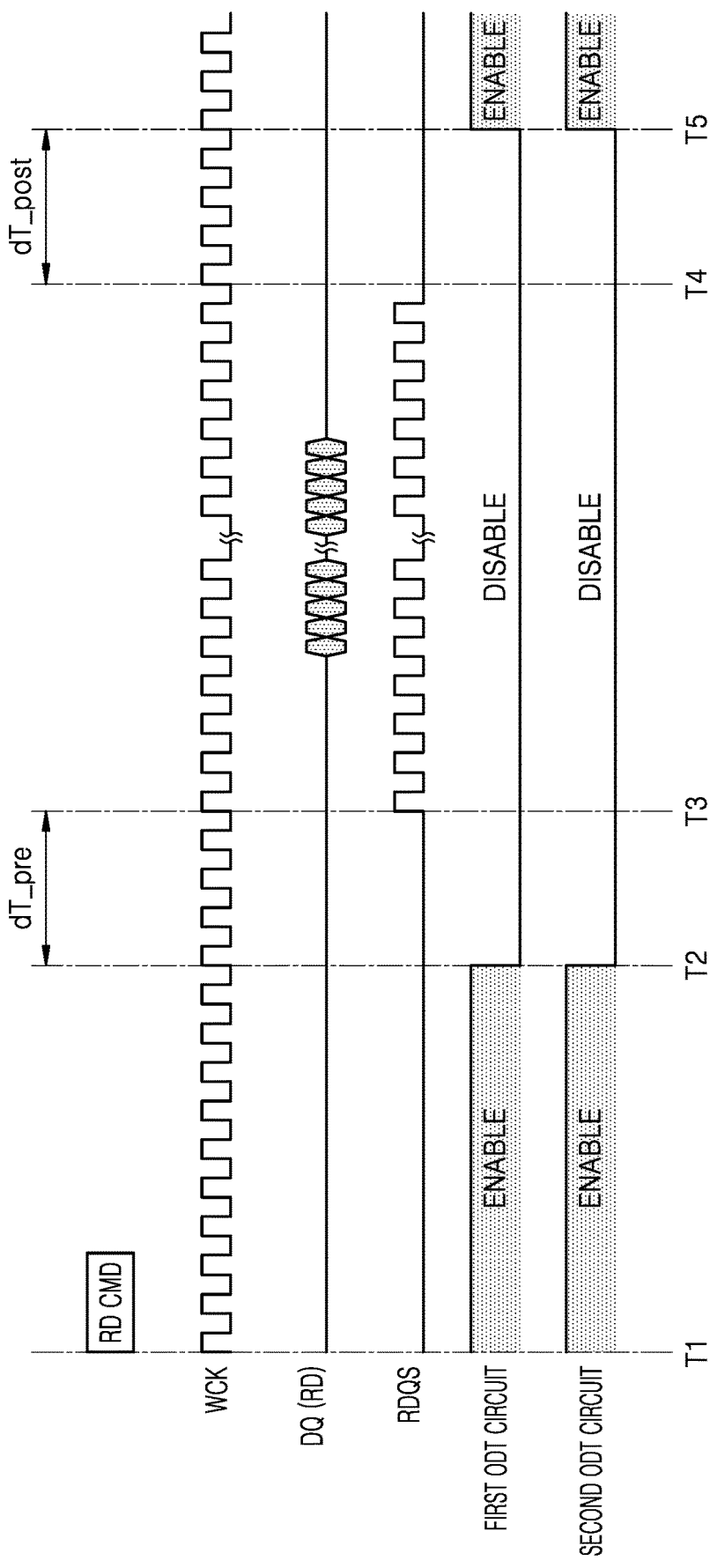
FIG. 10 is a timing chart of various signals of a memory rank, according to the related art.

FIG. 10 is a timing chart of various signals of a memory rank, according to the related art. In particular, FIG. 10 illustrates a timing chart when the memory rank receives a data read command.

In the memory rank according to the related art, an ODT circuit connected to a data pin and an ODT circuit connected to a read data strobe pin are simultaneously enabled or disabled. In other words, the ODT circuit connected to the data pin and the ODT circuit connected to the read data strobe pin are controlled in the same manner. In the memory rank according to the related art, the ODT circuit connected to the data pin and the ODT circuit connected to the read data strobe pin are referred to as first and second ODT circuits, respectively. Hereinafter, for convenience of description, a data signal is referred to as a DQ signal and a read data strobe signal is referred to as an RDQS signal.

Referring to FIG. 10, a data read command RD CMD is received at the first time point T1.

After the data read command RD CMD is received, the first and second ODT circuits may be disabled at the second time point T2. The RDQS signal is received after a certain time elapses. A time difference between when the first and second ODT circuits are disabled and when the RDQS signal is received may be an RDQS preamble time dT_pre.

Even after the RDQS signal is completely received, the first and second ODT circuits remain disabled during a certain time period for post processing. Only when the certain time period elapses, are the first and second ODT circuits enabled. A time difference between when the RDQS signal is completely received and when the first and second ODT circuits are enabled may be an RDQS postamble time dT_post.

In other words, since the first and second ODT circuits remain disabled during the RDQS postamble time dT_post even after all data is read, write data cannot be input to the data pin. In other words, data cannot be written during the RDQS postamble time dT_post. For example, in the case of a read-to-write operation, a time delay may occur due to an RDQS postamble when data is written in the memory rank according to the related art described above, thereby causing performance degradation in the entire memory rank.

Figure 11:
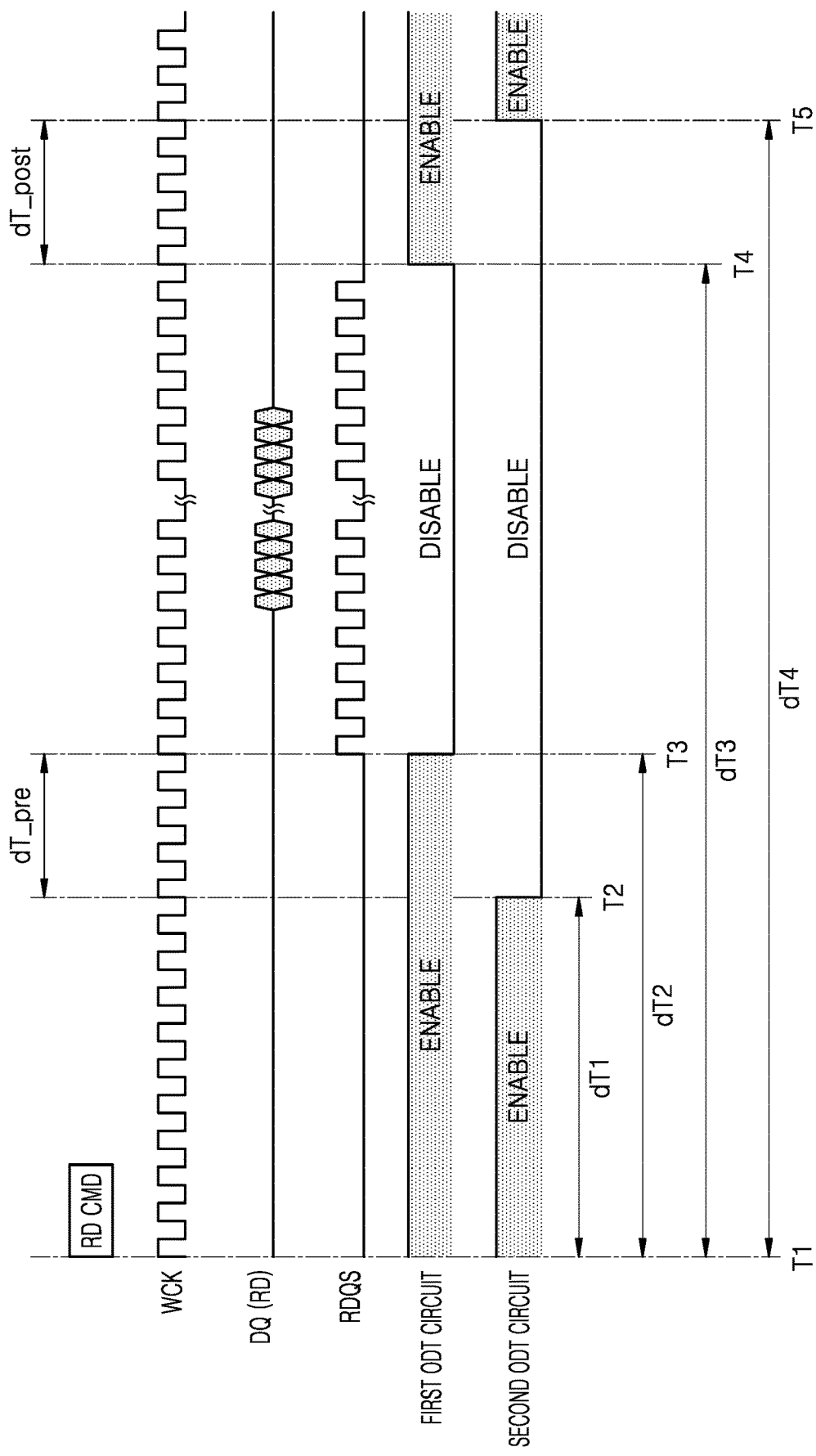
FIG. 11 is a timing chart of various signals of a memory rank, according to an exemplary embodiment of the inventive concept.

FIG. 11 is a timing chart of various signals of a memory rank, according to an exemplary embodiment of the inventive concept. In particular, FIG. 11 illustrates a timing chart when the memory rank receives a data read command. Descriptions will be made with reference to FIGS. 9 and 11. For convenience of description, it is assumed that the first memory rank 1310 is a target memory rank. However, the inventive concept is not limited thereto.

The data read command RD CMD may be input to the first memory rank 1310 at the first time point T1.

The first memory rank 1310 may disable the second ODT circuit 1312 at the second time point T2, in other words, after the first time period dT1 elapses from the first time point T1. For example, the ODT control circuit 1313 may control the second ODT circuit 1312 to be disabled at the second time point T2. The first time period dT1 may be a predetermined value and stored in a mode register included in the first memory rank 1310. In an exemplary embodiment of the inventive concept, the first time period dT1 may be an invariable value or a variable value that may vary with read latency.

The first memory rank 1310 may disable the first ODT circuit 1311 at the third time point T3, in other words, after the second time period dT2 elapses from the first time point T1. For example, the ODT control circuit 1313 may control the first ODT circuit 1311 to be disabled at the third time point T3. The second time period dT2 may be a predetermined value and stored in a mode register included in the first memory rank 1310. In an exemplary embodiment of the inventive concept, the second time period dT2 may be an invariable value or a variable value that may vary with read latency. The second time period dT2 may be greater than the first time period dT1 by the RDQS preamble time dT_pre. As a non-limiting example, the RDQS preamble time dT_pre may correspond to one through four clock cycles of the data clock signal WCK and may vary in accordance with exemplary embodiments of the inventive concept.

The first memory rank 1310 may enable the first ODT circuit 1311 at the fourth time point T4, in other words, after the third time period dT3 elapses from the first time point T1. For example, the ODT control circuit 1313 may control the first ODT circuit 1311 to be enabled at the fourth time point T4. The third time period dT3 may be a predetermined value and stored in a mode register included in the first memory rank 1310. In an exemplary embodiment of the inventive concept, the third time period dT3 may be an invariable value or a variable value that may vary with read latency.

In an exemplary embodiment of the inventive concept, an RDQS signal may be output from the first memory rank 1310 in the time period between the third time point T3 and the fourth time point T4. In addition, a DQ signal may be output during a portion of the time period during which the RDQS signal is output. The DQ signal may represent data read from memory cells of the first memory rank 1310.

The first memory rank 1310 may enable the second ODT circuit 1312 at the fifth time point T5, in other words, after the fourth time period dT4 elapses from the first time point T1. For example, the ODT control circuit 1313 may control the second ODT circuit 1312 to be enabled at the fifth time point T5. The fourth time period dT4 may be a predetermined value and stored in a mode register included in the first memory rank 1310. In an exemplary embodiment of the inventive concept, the fourth time period dT4 may be an invariable value or a variable value that may vary with read latency. The fourth time period dT4 may be greater than the third time period dT3 by the RDQS postamble time dT_post. As a non-limiting example, the RDQS postamble time dT_post may correspond to one through four clock cycles of the data clock signal WCK and may vary in accordance with exemplary embodiments of the inventive concept.

Figure 12:
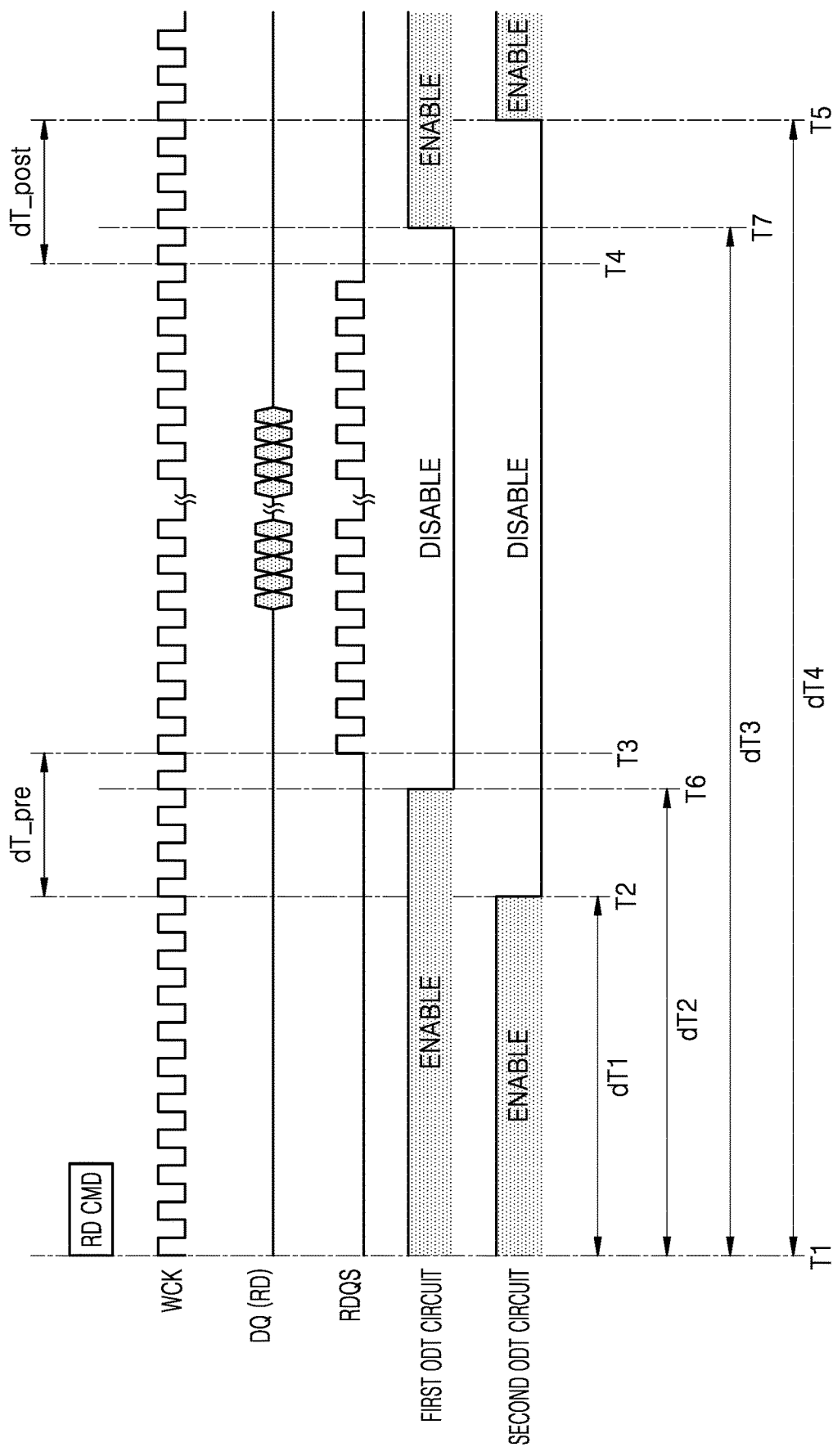
FIG. 12 is a timing chart of various signals of a memory rank, according to an exemplary embodiment of the inventive concept.

FIG. 12 is a timing chart of various signals of a memory rank, according to an exemplary embodiment of the inventive concept. Description will be focused on the differences between FIGS. 11 and 12. The description will be made with reference to FIGS. 9 and 12.

The first memory rank 1310 may disable the first ODT circuit 1311 at the sixth time point T6, in other words, after the second time period dT2 elapses from the first time point T1. For example, the ODT control circuit 1313 may control the first ODT circuit 1311 to be disabled at the sixth time point T6. The second time period dT2 may be a predetermined value and stored in a mode register included in the first memory rank 1310. In an exemplary embodiment of the inventive concept, the second time period dT2 may be an invariable value or a variable value that may vary with read latency. As a non-limiting example, the RDQS preamble time dT_pre may correspond to one through four clock cycles of the data clock signal WCK and may vary in accordance with exemplary embodiments of the inventive concept.

The first memory rank 1310 may enable the first ODT circuit 1311 at the seventh time point 17, in other words, after the third time period dT3 elapses from the first time point T1. For example, the ODT control circuit 1313 may control the first ODT circuit 1311 to be enabled at the seventh time point T7. The third time period dT3 may be a predetermined value and stored in a mode register included in the first memory rank 1310. In an exemplary embodiment of the inventive concept, the third time period dT3 may be an invariable value or a variable value that may vary with read latency.

Unlike the embodiment illustrated in FIG. 11, the sixth time point T6 at which the first ODT circuit 1311 is disabled may be earlier than the third time point T3 at which the RDQS signal starts to be output. In addition, the seventh time point T7 at which the first ODT circuit 1311 is enabled may be later than the fourth time point T4 at which the RDQS signal is completely output.

Figure 13:
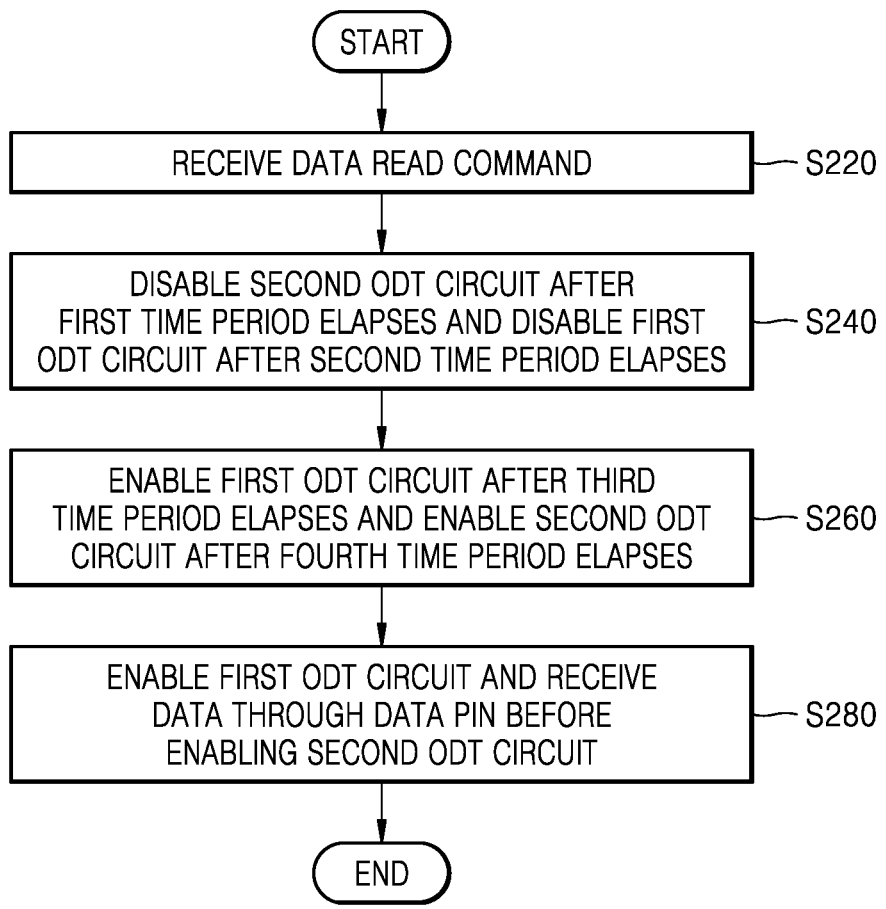
FIG. 13 is a flowchart of a method of operating a memory rank, according to an exemplary embodiment of the inventive concept.

FIG. 13 is a flowchart of a method of operating a memory rank, according to an exemplary embodiment of the inventive concept. Description will be made with reference to FIGS. 9 through 13. For convenience of description, it is assumed that the memory rank is the first memory rank 1310 and the first memory rank 1310 is a target memory rank. However, the inventive concept is not limited thereto.

The first memory rank 1310 may receive the data read command RD CMD in operation S220. For example, the first memory rank 1310 may receive the data read command RD CMD from a memory controller. The data read command RD CMD may be received at the first time point T1.

The first memory rank 1310 may disable the second ODT circuit 1312 after the first time period dT1 elapses from the first time point T1, and disable the first ODT circuit 1311 after the second time period dT2 elapses from the first time point T1 in operation S240. The second time period dT2 may be different from the first time period dT1, and the second time period dT2 may be greater than the first time period dT1. A portion of the second time period dT2 may overlap with the first time period dT1.

The first memory rank 1310 may enable the first ODT circuit 1311 after the third time period dT3 elapses from the first time point T1, and enable the second ODT circuit 1312 after the fourth time period dT4 elapses from the first time point T1 in operation S260. The fourth time period dT4 may be different from the third time period dT3, and the fourth time period dT4 may be greater than the third time period dT3. A portion of the fourth time period dT4 may overlap with the third time period dT3.

The first memory rank 1310 may receive the data DQ through the data pin 1314_1 before the second ODT circuit 1312 is enabled after the first ODT circuit 1311 is enabled in operation S280.

According to an exemplary embodiment of the inventive concept, the first memory rank 1310 may independently control the enable timing of the first ODT circuit 1311 and the enable timing of the second ODT circuit 1312, thereby receiving the data DQ through the data pin 1314_1 without waiting for the second ODT circuit 1312 to be enabled. Accordingly, performance degradation of a device including such circuitry may be prevented.

In particular, when a data read operation and a data write operation are consecutively performed such as in a read-to-write operation, the first memory rank 1310 may receive the data DQ through the data pin 1314_1 without standing by during a RDQS postamble time, thereby enhancing performance.

While the inventive concept has been particularly shown and described with reference to exemplary embodiments thereof, it will be understood that various changes in form and details may be made thereto without departing from the spirit and scope of the inventive concept as set forth in the following claims.

What is claimed is:
1. A memory device, comprising:
a first on-die termination circuit connected to a data pin for transmitting or receiving a data signal and, when enabled, the first on-die termination circuit is configured to provide a first termination resistance to a signal line connected to the data pin;
a second on-die termination circuit connected to a read data strobe pin for transmitting or receiving a read data strobe signal and, when enabled, the second on-die termination circuit is configured to provide a second termination resistance to a signal line connected to the read data strobe pin; and
an on-die termination control circuit configured to independently control an enable timing and a disable timing of the first on-die termination circuit and an enable timing and a disable timing of the second on-die termination circuit,
wherein in response to the memory device receiving a read command from a memory controller at a first time point, the on-die termination control circuit is configured to control the second on-die termination circuit in an enable state to be disabled after a first time period from the first time point, control the first on-die termination circuit in an enable state to be disabled after a second time period from the first time point, control the first on-die termination circuit in the disable state to be enabled after a third time period from the first time point, and control the second on-die termination circuit in the disable state to be enabled after a fourth time period from the first time point, and wherein the first time period is shorter than the second time period, the second time period is shorter than the third time period, and the third time period is shorter than the fourth time period.

2. The memory device of claim 1,
wherein the first time period, the second time period, the third time period, and the fourth time period are stored in the memory device.

3. The memory device of claim 1,
wherein the second time period is greater than the first time period by a read data strobe signal preamble time.

4. The memory device of claim 1,
wherein the fourth time period is greater than the third time period by a read data strobe signal postamble time.

5. The memory device of claim 1,
wherein the memory device transmits at least a portion of the data signal to the memory controller before the first on-die termination circuit is enabled after the first on-die termination circuit is disabled, and transmits the read data strobe signal to the memory controller before the second on-die termination circuit is enabled after the second on-die termination circuit is disabled.

6. The memory device of claim 1,
wherein the memory device receives at least a portion of the data signal from the memory controller through the data pin before the second on-die termination circuit is enabled after the first on-die termination circuit is enabled.

7. The memory device of claim 1,
wherein the memory device provides an indicator signal to the memory controller through a mode register, the indicator signal indicating that the memory device has an ability to independently control the first on-die termination circuit and the second on-die termination circuit.

8. The memory device of claim 1,
wherein the first time period, the second time period, the third time period, and the fourth time period are determined based on a read latency, respectively.

9. The memory device of claim 1,
wherein the memory device receives at least a portion of the data signal from the memory controller through the data pin at a time of transition between the enable state of the second on-die termination circuit and the disable state of the second on-die termination circuit.

10. A sub-memory system, comprising:
a first memory rank; and
a second memory rank,
wherein the first memory rank includes:
  a first on-die termination circuit connected to a data pin for transmitting or receiving a data signal and, when enabled, the first on-die termination circuit is configured to provide a first termination resistance to a signal line connected to the data pin;
  a second on-die termination circuit connected to a read data strobe pin for transmitting or receiving a read data strobe signal and, when enabled, the second on-die termination circuit is configured to provide a second termination resistance to a signal line connected to the read data strobe pin; and
  an on-die termination control circuit configured to independently control an enable timing and a disable timing of the first on-die termination circuit and an enable timing and a disable timing of the second on-die termination circuit,
wherein in response to the memory device receiving a read command for the first memory rank from a memory controller at a first time point, the on-die termination control circuit is configured to control the second on-die termination circuit in an enable state to be disabled after a first time period from the first time point, control the first on-die termination circuit in an enable state to be disabled after a second time period from the first time point, control the first on-die termination circuit in the disable state to be enabled after a third time period from the first time point, and control the second on-die termination circuit in the disable state to be enabled after a fourth time period from the first time point,
wherein the first time period is shorter than the second time period, the second time period is shorter than the third time period, and the third time period is shorter than the fourth time period,
wherein the second memory rank includes a third on-die termination circuit connected to the data pin and a fourth on-die termination circuit connected to the read data strobe pin, and
wherein at least one of the third on-die termination circuit or the fourth on-die termination circuit is maintained enabled while at least one of the first on-die termination circuit or the second on-die termination circuit is in the disable state.

11. The sub-memory system of claim 10,
wherein the first time period, the second time period, the third time period, and the fourth time period are stored in the sub-memory system.

12. The sub-memory system of claim 10,
wherein the second time period is greater than the first time period by a read data strobe signal preamble time.

13. The sub-memory system of claim 10,
wherein the fourth time period is greater than the third time period by a read data strobe signal postamble time.

14. The sub-memory system of claim 10,
wherein the sub-memory system provides an indicator signal to the memory controller through a mode register, the indicator signal indicating that the sub-memory system has an ability to independently control the first on-die termination circuit and the second on-die termination circuit.

15. The sub-memory system of claim 10,
wherein the first time period, the second time period, the third time period, and the fourth time period are determined based on a read latency, respectively.

16. The sub-memory system of claim 10,
wherein the sub-memory system receives at least a portion of the data signal from the memory controller through the data pin at a time of transition between the enable state of the second on-die termination circuit and the disable state of the second on-die termination circuit.

17. A memory device, comprising:
a first on-die termination circuit connected to a data pin for transmitting or receiving a data signal and, when enabled, the first on-die termination circuit is configured to provide a first termination resistance to a signal line connected to the data pin;
a second on-die termination circuit connected to a read data strobe pin for transmitting or receiving a read data strobe signal and, when enabled, the second on-die termination circuit is configured to provide a second termination resistance to a signal line connected to the read data strobe pin; and
an on-die termination control circuit is configured to independently control an enable timing and a disable timing of the first on-die termination circuit and an enable timing and a disable timing of the second on-die termination circuit, wherein in response to the memory device receiving a read command from a memory controller at a first time point, the on-die termination control circuit configured to control the second on-die termination circuit in an enable state to be disabled after a first time period from the first time point, control the first on-die termination circuit in an enable state to be disabled after a second time period from the first time point, control the first on-die termination circuit in the disable state to be enabled after a third time period from the first time point, and control the second on-die termination circuit in the disable state to be enabled after a fourth time period from the first time point, and wherein the memory device receives at least a portion of the data signal from the memory controller through the data pin at a time of transition between the enable state of the second on-die termination circuit and the disable state of the second on-die termination circuit, and wherein the first on-die termination circuit is in the enable state while the memory device receives the at least a portion of the data signal.

18. The memory device of claim 17
wherein the first time period is shorter than the second time period, the second time period is shorter than the third time period, and the third time period is shorter than the fourth time period.

19. The memory device of claim 17
wherein the memory device provides an indicator signal to the memory controller through a mode register, the indicator signal indicating that the memory device has an ability to independently control the first on-die termination circuit and the second on-die termination circuit.

20. The memory device of claim 17,
wherein the first time period, the second time period, the third time period, and the fourth time period are determined based on a read latency, respectively.

* * * * *